US009252103B2

(12) United States Patent
Ishizuka et al.

(10) Patent No.: US 9,252,103 B2
(45) Date of Patent: Feb. 2, 2016

(54) METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Akihiro Ishizuka, Kanagawa (JP); Yutaka Yonemitsu, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/558,989

(22) Filed: Dec. 3, 2014

(65) Prior Publication Data

US 2015/0084049 A1    Mar. 26, 2015

Related U.S. Application Data

(62) Division of application No. 13/156,472, filed on Jun. 9, 2011, now Pat. No. 8,906,737.

(30) Foreign Application Priority Data

Jun. 18, 2010 (JP) .................................. 2010-139715

(51) Int. Cl.
*H01L 29/10* (2006.01)
*H01L 23/535* (2006.01)
(Continued)

(52) U.S. Cl.
CPC ........ *H01L 23/535* (2013.01); *H01L 21/31111* (2013.01); *H01L 27/1225* (2013.01); *H01L 29/7869* (2013.01); *H01L 2924/0002* (2013.01)

(58) Field of Classification Search
CPC ............ H01L 27/1214; H01L 29/7869; H01L 29/78666; H01L 27/1251; H01L 29/4908

USPC ............ 438/104, 701, 151, 478, 116; 257/21, 257/43, 53, 59, 79, 88, 113, 225
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001945855 A | 4/2007 |
| CN | 101656271 A | 2/2010 |

(Continued)

OTHER PUBLICATIONS

International Search Report (Application No. PCT/JP2011/063092) Dated Jul. 12, 2011.

(Continued)

*Primary Examiner* — Jarrett Stark
*Assistant Examiner* — Shahed Ahmed
(74) *Attorney, Agent, or Firm* — Fish & Richardson P.C.

(57) ABSTRACT

An object is to provide a method for manufacturing a semiconductor device including an oxide semiconductor and having improved electric characteristics. The semiconductor device includes an oxide semiconductor film, a gate electrode overlapping the oxide semiconductor film, and a source electrode and a drain electrode electrically connected to the oxide semiconductor film. The method includes the steps of forming a first insulating film including gallium oxide over and in contact with the oxide semiconductor film; forming a second insulating film over and in contact with the first insulating film; forming a resist mask over the second insulating film; forming a contact hole by performing dry etching on the first insulating film and the second insulating film; removing the resist mask by ashing using oxygen plasma; and forming a wiring electrically connected to at least one of the gate electrode, the source electrode, and the drain electrode through the contact hole.

16 Claims, 11 Drawing Sheets

(51) Int. Cl.
*H01L 21/311* (2006.01)
*H01L 27/12* (2006.01)
*H01L 29/786* (2006.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,495,644 | B2 * | 2/2009 | Hirakata .................. 345/92 |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,683,375 | B2 | 3/2010 | Tanaka |
| 7,732,819 | B2 | 6/2010 | Akimoto et al. |
| 7,741,643 | B2 | 6/2010 | Miyazaki et al. |
| 7,791,072 | B2 | 9/2010 | Kumomi et al. |
| 7,871,846 | B2 | 1/2011 | Tanaka |
| 7,906,780 | B2 | 3/2011 | Iwasaki |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,183,099 | B2 * | 5/2012 | Sakata .................. 438/149 |
| 8,188,480 | B2 | 5/2012 | Itai |
| 8,203,143 | B2 | 6/2012 | Imai |
| 8,278,657 | B2 * | 10/2012 | Sakata et al. .................. 257/43 |
| 8,445,902 | B2 | 5/2013 | Sato et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0087486 | A1 | 4/2007 | Tanaka |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0237600 | A1 | 10/2008 | Miyazaki et al. |
| 2008/0237875 | A1 | 10/2008 | Yamazaki et al. |
| 2008/0237876 | A1 | 10/2008 | Sasagawa |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0280385 | A1 | 11/2008 | Tanaka |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0321731 | A1 | 12/2009 | Jeong et al. |
| 2009/0321732 | A1 | 12/2009 | Kim et al. |
| 2010/0006833 | A1 | 1/2010 | Ha et al. |
| 2010/0038641 | A1 | 2/2010 | Imai |
| 2010/0044711 | A1 | 2/2010 | Imai |
| 2010/0051937 | A1 | 3/2010 | Kaji et al. |
| 2010/0051949 | A1 | 3/2010 | Yamazaki et al. |
| 2010/0059746 | A1 | 3/2010 | Itai |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0163863 | A1 | 7/2010 | Yaegashi |
| 2010/0176461 | A1 | 7/2010 | Sasagawa |
| 2010/0210106 | A1 * | 8/2010 | Suda et al. .................. 438/666 |
| 2010/0224871 | A1 * | 9/2010 | Yamaguchi et al. .......... 257/43 |
| 2010/0283105 | A1 | 11/2010 | Yamazaki et al. |
| 2011/0193083 | A1 | 8/2011 | Kim et al. |
| 2011/0198602 | A1 | 8/2011 | Nanbu et al. |
| 2011/0240990 | A1 | 10/2011 | Yamazaki |
| 2011/0240991 | A1 | 10/2011 | Yamazaki |
| 2011/0248345 | A1 | 10/2011 | Sasagawa |
| 2012/0061668 | A1 * | 3/2012 | Miyairi et al. .................. 257/43 |
| 2012/0119205 | A1 | 5/2012 | Taniguchi et al. |
| 2013/0313550 | A1 | 11/2013 | Yamazaki |

FOREIGN PATENT DOCUMENTS

| | | |
|---|---|---|
| CN | 101882630 A | 11/2010 |
| EP | 1737044 A | 12/2006 |
| EP | 2157615 A | 2/2010 |
| EP | 2159845 A | 3/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-243335 A | 8/2003 |
| JP | 2004-103957 A | 4/2004 |
| JP | 2004-273614 A | 9/2004 |
| JP | 2004-273732 A | 9/2004 |
| JP | 2004-335848 A | 11/2004 |
| JP | 2006-126255 A | 5/2006 |
| JP | 2006-165528 A | 6/2006 |
| JP | 2007-103569 A | 4/2007 |
| JP | 2007-201366 A | 8/2007 |
| JP | 2008-135520 A | 6/2008 |
| JP | 2008-270723 A | 11/2008 |
| JP | 2009-115992 A | 5/2009 |
| JP | 2009-231613 A | 10/2009 |
| JP | 2009-260329 A | 11/2009 |
| JP | 2009-272427 A | 11/2009 |
| JP | 2010-016347 A | 1/2010 |
| JP | 2010-045263 A | 2/2010 |
| JP | 2010-045309 A | 2/2010 |
| JP | 2010-067954 A | 3/2010 |
| JP | 2010-074138 A | 4/2010 |
| JP | 2010-080952 A | 4/2010 |
| JP | 2010-087068 A | 4/2010 |
| JP | 2010-134458 A | 6/2010 |
| KR | 2007-0037692 A | 4/2007 |
| KR | 2010-0027067 A | 3/2010 |
| WO | WO-2004/114391 | 12/2004 |
| WO | WO-2007/086291 | 8/2007 |
| WO | WO-2008/099843 | 8/2008 |
| WO | WO-2009/136645 | 11/2009 |

OTHER PUBLICATIONS

Written Opinion (Application No. PCT/JP2011/063092) Dated Jul. 12, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350 ° C.", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol—Gel—Derived Zinc Oxide Films by Irradiation with Ultraviolet Lamp", Journal of Sol—Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a charge-generation layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM—FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] at Temperatures over 1000 ° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review, A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review, B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

METHOD FOR MANUFACTURING SEMICONDUCTOR DEVICE

CROSS-REFERENCE TO RELATED APPLICATIONS

This application is a divisional of U.S. application Ser. No. 13/156,472, filed Jun. 9, 2011, now allowed, which claims the benefit of a foreign priority application filed in Japan as Serial No. 2010-139715 on Jun. 18, 2010, both of which are incorporated by reference.

TECHNICAL FIELD

The present invention relates to a semiconductor device and a method for manufacturing the semiconductor device.

In this specification, a semiconductor device generally means a device which can function by utilizing semiconductor characteristics, and electrooptic devices, semiconductor circuits, and electronic devices are all semiconductor devices.

BACKGROUND ART

A technique by which a transistor is manufactured using a semiconductor thin film formed over a substrate having an insulating surface has been attracting attention. The transistor is applied to a wide range of electronic devices such as an integrated circuit (IC) or an image display device (a display device). A silicon-based semiconductor material is widely known as a material for a semiconductor thin film applicable to a transistor. As another material, an oxide semiconductor has been attracting attention.

For example, a transistor whose semiconductor layer used for a channel formation region is formed using an amorphous oxide including indium (In), gallium (Ga), and zinc (Zn) and having an electron carrier concentration lower than $10^{18}/cm^3$ is disclosed (see Patent Document 1).

REFERENCE

Patent Document

[Patent Document 1] Japanese Published Patent Application No. 2006-165528

DISCLOSURE OF INVENTION

However, the electric conductivity of an oxide semiconductor might change when deviation from the stoichiometric composition ratio due to deficiency of oxygen or the like occurs, or when hydrogen or water behaving as electron donor enters the oxide semiconductor during a manufacturing process of a device. Such phenomena are factors of variation in electric characteristics of a semiconductor device such as a transistor including an oxide semiconductor.

In view of the above problem, an object is to provide a method for manufacturing a semiconductor device including an oxide semiconductor and having improved electric characteristics.

Another object is to solve a problem which may arise in the manufacture of the semiconductor device including an oxide semiconductor and having improved electric characteristics.

In one embodiment of the present invention, an insulating film including a constituent element of an oxide semiconductor film (e.g., an insulating film including gallium oxide) is provided so as to be in contact with the oxide semiconductor film, and direct wet treatment is not used in an etching step of the insulating film, whereby a favorable condition is maintained at an interface between the oxide semiconductor film and the insulating film. More concretely, the following structure can be given as example.

One embodiment of the disclosed invention is a method for manufacturing a semiconductor device including an oxide semiconductor film, a gate electrode, and a source electrode and a drain electrode that are electrically connected to the oxide semiconductor film. The method includes the steps of forming the oxide semiconductor film over the gate electrode; forming a first insulating film including gallium oxide over and in contact with the oxide semiconductor film, the source electrode, and the drain electrode; forming a second insulating film over and in contact with the first insulating film; forming a resist mask over the second insulating film; forming a contact hole by performing dry etching on the first insulating film and the second insulating film; removing the resist mask by ashing using oxygen plasma; and forming a wiring electrically connected to at least one of the gate electrode, the source electrode, and the drain electrode through the contact hole.

Another embodiment of the disclosed invention is a method for manufacturing a semiconductor device including an oxide semiconductor film, a gate electrode, and a source electrode and a drain electrode that are electrically connected to the oxide semiconductor film. The method includes the steps of forming a first insulating film including gallium oxide over and in contact with the oxide semiconductor film, the source electrode, and the drain electrode; forming the gate electrode over and in contact with the first insulating film to overlap with the oxide semiconductor film; forming a second insulating film over and in contact with the first insulating film; forming a resist mask over the second insulating film; forming a contact hole by performing dry etching on the first insulating film and the second insulating film; removing the resist mask by ashing using oxygen plasma; and forming a wiring electrically connected to at least one of the source electrode and the drain electrode through the contact hole.

In the above structure, the diameter of the contact hole in the first insulating film is preferably smaller than the diameter of the contact hole in the second insulating film. The thickness of the second insulating film is preferably larger than the thickness of the first insulating film.

Further, a gas including fluorine is preferably used in the dry etching.

In the case where the first insulating film further includes aluminum oxide, a gas including chlorine is preferably used in the dry etching.

In addition, it is preferable that the first insulating film be formed while applying heat.

Further, the oxide semiconductor film is preferably an i-type oxide semiconductor film. Here, an i-type (intrinsic) oxide semiconductor refers to an oxide semiconductor which is highly purified by removing hydrogen, which is an n-type impurity for an oxide semiconductor, from the oxide semiconductor so that impurities that are not main components of the oxide semiconductor are included as few as possible, and in which oxygen deficiency defects are reduced by supplying oxygen. In an i-type oxide semiconductor film, hydrogen atoms serving as electron donors and defects due to oxygen deficiency are sufficiently reduced; therefore, degradation of the interface characteristics due to impurities and defects can be suppressed.

Note that purification of an oxide semiconductor also has an effect of preventing variation in electric characteristics of a transistor. Therefore, purification of an oxide semiconductor is extremely effective for improvement in transistor characteristics.

According to one embodiment of the present invention, a method for manufacturing a semiconductor device in which a favorable condition is maintained at an interface between an oxide semiconductor film and an insulating film can be provided. Thus, a method for manufacturing a semiconductor device having improved electric characteristics can be provided.

BRIEF DESCRIPTION OF DRAWINGS

In the accompanying drawings:

FIGS. 4A, 4B1, and 4B2 illustrate discharge states in an AC sputtering method;

BEST MODE FOR CARRYING OUT THE INVENTION

Figure 1A:
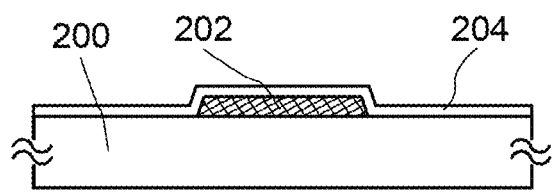
FIGS. 1A to 1E illustrate an example of a manufacturing process of a semiconductor device.

Hereinafter, embodiments and an example of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments. Note that in the following description, portions that are common between drawings are denoted by the same reference numerals, and repeated description is omitted.

Note that in this specification the ordinal numbers such as "first" and "second" are used for convenience and do not denote the order of steps or the stacking order of layers. In addition, the ordinal numbers in this specification do not denote particular names which specify the invention.

Embodiment 1

In this embodiment, one embodiment of a semiconductor device and one embodiment of a method for manufacturing the semiconductor device will be described with reference to FIGS. 1A to 1E, FIGS. 2A to 2C, FIGS. 3A to 3E, and FIGS. 4A, 4B1, and 4B2.

<Manufacturing Process of Transistor 110>

FIGS. 1A to 1E are cross-sectional views illustrating a manufacturing process of a transistor 110 as an example of a method for manufacturing a semiconductor device according to one embodiment of the disclosed invention. Here, the transistor 110 includes, over a substrate 200, a gate electrode 202, an insulating film 204, an oxide semiconductor film 206, a source electrode 208a, a drain electrode 208b, an insulating film 210, an insulating film 212, and a wiring 216. In the transistor illustrated in FIG. 1E, the insulating film 210, including gallium oxide, is provided in contact with the oxide semiconductor film 206, and the insulating film 212 is provided over and in contact with the insulating film 210 including gallium oxide. In addition, the wiring 216 is electrically connected to the source electrode 208a through a contact hole 218 formed in the insulating film 212 and the insulating film 210.

Here, the oxide semiconductor film 206 is preferably an oxide semiconductor film which is highly purified by sufficiently removing impurities such as hydrogen or water, or by sufficiently supplying oxygen. Specifically, the hydrogen concentration of the oxide semiconductor film 206 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower, for example. Note that the hydrogen concentration of the oxide semiconductor film 206 is measured by secondary ion mass spectrometry (SIMS). In the oxide semiconductor film 206 which is highly purified by sufficiently reducing the hydrogen concentration and in which defect levels in the energy gap due to oxygen deficiency are reduced by sufficiently supplying oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. In this manner, by using an i-type oxide semiconductor, a transistor having favorable electric characteristics can be obtained.

In many cases, an oxide semiconductor material used for the oxide semiconductor film 206 includes gallium. Therefore, when the insulating film 204 or the insulating film 210, which is in contact with the oxide semiconductor film, is formed using a material including gallium oxide, a favorable condition can be maintained at an interface between the oxide semiconductor film and the insulating film. For example, by providing the oxide semiconductor film in contact with the insulating film including gallium oxide, an accumulation of hydrogen at an interface between the oxide semiconductor film and the insulating film can be reduced. This is because a material including gallium oxide is compatible with an oxide semiconductor material.

Note that, in the case where an element belonging to the same group as a constituent element of the oxide semiconductor is used for the insulating film 204 or the insulating film 210, a similar effect can be obtained. That is, it is also effective to additionally use a material including aluminum oxide or the like for the insulating film 204 or the insulating film 210. Aluminum oxide tends to resist to water penetration; therefore, it is preferable to use a material including aluminum oxide in the optic of preventing water from entering the oxide semiconductor film. For example, a material including gallium and aluminum, such as aluminum gallium oxide (or gallium aluminum oxide) may be used for the insulating film 204 or the insulating film 210. In this case, both the effect resulting from inclusion of gallium and the effect resulting from inclusion of aluminum can be obtained, which is preferable. By providing the oxide semiconductor film in contact with an insulating film including aluminum gallium oxide, for example, water can be prevented from entering the oxide semiconductor film and an accumulation of hydrogen at an interface between the oxide semiconductor film and the insulating film can be sufficiently reduced.

An example of the manufacturing process of the transistor 110 illustrated in FIG. 1E will be described below with reference to FIGS. 1A to 1E.

First, a conductive film for forming the gate electrode (including a wiring formed in the same layer as the gate electrode) is formed over the substrate 200 and then processed, so that the gate electrode 202 is formed. After that, the insulating film 204 is formed so as to cover the gate electrode 202 (see FIG. 1A).

There is no particular limitation on the material or the like of the substrate 200 as long as the material has heat resistance enough to withstand at least heat treatment performed later. For example, a glass substrate, a ceramic substrate, a quartz substrate, a sapphire substrate, or the like can be used as the substrate 200. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Further alternatively, any of these substrates provided with a semiconductor element may be used as the substrate 200.

A flexible substrate may be used as the substrate 200. In the case where a transistor is provided over a flexible substrate, for example, the transistor can be directly formed over the flexible substrate.

As the conductive film used for the gate electrode 202, for example, a metal film including an element selected from molybdenum, titanium, tantalum, tungsten, aluminum, copper, neodymium, and scandium; an alloy material including any of these elements as a main component; or the like can be used. The gate electrode 202 may have a single-layer structure or a stacked-layer structure.

The conductive film can be processed by being etched after a mask having a desired shape is formed over the conductive film. As the above mask, a resist mask or the like can be used.

The insulating film 204 functions as a gate insulating film of the transistor 110. The insulating film 204 is formed using, for example, a material such as silicon oxide, silicon nitride, silicon oxynitride, or silicon nitride oxide. Further, the insulating film 204 can be formed using a material including gallium oxide. The material including gallium oxide may further include aluminum oxide; that is, a material including aluminum gallium oxide or gallium aluminum oxide, or the like may be used. Here, aluminum gallium oxide refers to a substance that includes aluminum at a content (atomic %) higher than that of gallium, and gallium aluminum oxide refers to a substance that includes gallium at a content (atomic %) higher than or equal to that of aluminum. A material having a high dielectric constant, such as hafnium oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added may be used. The insulating film 204 can be formed to have a single-layer structure or a stacked-layer structure using any of the above materials.

A gallium oxide film used as the insulating film 204 preferably has a composition of $Ga_2O_{3+\alpha}$ ($\alpha$>0). It is preferable that a be greater than or equal to 3.04 and less than or equal to 3.09. Alternatively, an aluminum gallium oxide film used as the insulating film 204 preferably has a composition of $Al_xGa_{2-x}O_{3+\alpha}$ (1<x<2, $\alpha$>0). Further alternatively, a gallium aluminum oxide film used as the insulating film 204 preferably has a composition of $Al_xGa_{2-x}O_{3+\alpha}$ (0<x≤1, $\alpha$>0) by being doped with oxygen.

In many cases, an oxide semiconductor material used for the oxide semiconductor film includes gallium. Therefore, in the case where the insulating film 204 which is in contact with the oxide semiconductor film is formed using a material including gallium oxide, a favorable condition can be maintained at an interface between the oxide semiconductor film and the insulating film 204. For example, by providing the oxide semiconductor film in contact with an insulating film including gallium oxide, an accumulation of hydrogen at an interface between the oxide semiconductor film and the insulating film can be reduced. This is because a material including gallium oxide is compatible with an oxide semiconductor material.

Note that, in the case where an element belonging to the same group as a constituent element of the oxide semiconductor is used for the insulating film 204, a similar effect can be obtained. That is, it is also effective to additionally use a material including aluminum oxide or the like for the insulating film 204. Aluminum oxide tends to resist to water penetration; therefore, it is preferable to use the material including aluminum oxide in the optic of preventing water from entering the oxide semiconductor film. For example, a material including gallium and aluminum, such as aluminum gallium oxide (or gallium aluminum oxide) described above may be used for the insulating film 204. In this case, both the effect resulting from inclusion of gallium and the effect resulting from inclusion of aluminum can be obtained, which is preferable. By providing the oxide semiconductor film in contact with an insulating film including aluminum gallium oxide, for example, water can be prevented from entering the oxide semiconductor film and an accumulation of hydrogen at an interface between the oxide semiconductor film and the insulating film can be sufficiently reduced.

The insulating film 204 is preferably formed by a method with which impurities such as hydrogen or water do not enter the insulating film 204. This is because, when impurities such as hydrogen or water are included in the insulating film 204, the impurities such as hydrogen or water enter the oxide semiconductor film formed later or oxygen in the oxide semiconductor film is extracted by the impurities such as hydrogen or water, so that a back channel of the oxide semiconductor film might have lower resistance (have n-type conductivity) and a parasitic channel might be formed. Therefore, the insulating film 204 is preferably formed so as to include impurities such as hydrogen or water as few as possible. For example, the insulating film 204 is preferably formed by a sputtering method, and a high-purity gas from which impurities such as hydrogen or water are removed is preferably used as a sputtering gas used for film formation.

Examples of the sputtering method include a DC sputtering method in which a direct current power source is used, a pulsed DC sputtering method in which a direct bias is applied in a pulsed manner, an AC sputtering method, and the like.

Figure 4A:
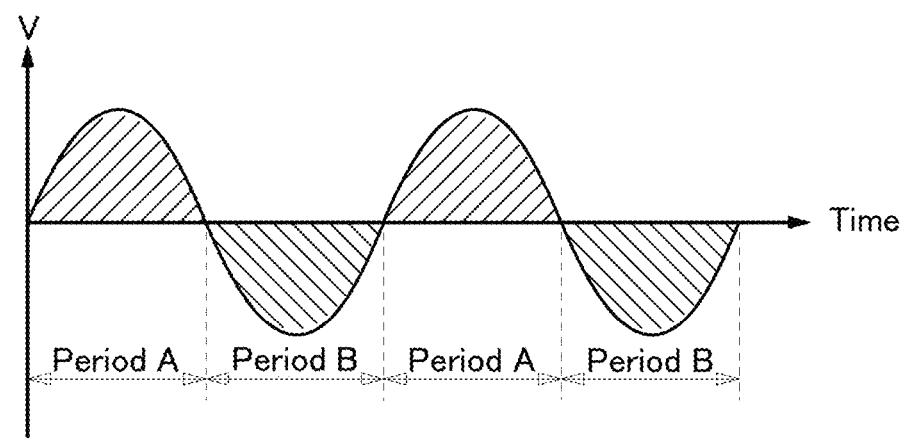
Figure 4A:
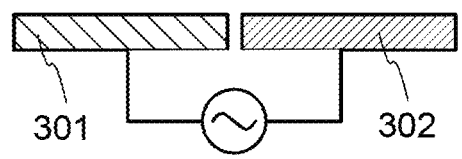
Figure 4A:
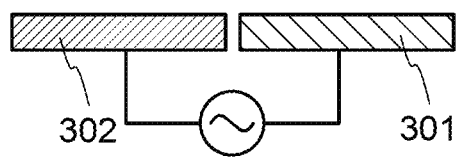

Here, a sputtering method using AC discharge will be described with reference to FIGS. 4A, 4B1, and 4B2. In AC discharge, adjacent targets alternately have a cathode potential and an anode potential. In a period A shown in FIG. 4A, a target 301 functions as a cathode and a target 302 functions as an anode as illustrated in FIG. 4B1. In a period B shown in FIG. 4A, the target 301 functions as an anode and the target 302 functions as a cathode as illustrated in FIG. 4B2. The total time of the period A and the period B is 20 μsec 50 μsec, and the period A and the period B are repeated at a constant frequency. In this manner, by making the two adjacent targets function as a cathode and as an anode alternately, stable discharge can be realized. As a result, even when a large-sized substrate is used, uniform discharge is possible; accordingly, uniform film characteristics can be obtained also in the case of using the large-sized substrate. Moreover, since the large-sized substrate can be used, productivity can be increased.

For example, in the AC sputtering method, aluminum oxide is used as the target 301 and gallium oxide is used as the target 302, whereby a gallium aluminum oxide film or an aluminum gallium oxide film can be formed. As the target 301 and the target 302, a gallium oxide target to which aluminum particles are added may be used. By using a gallium oxide target to which an aluminum element is added, conductivity of the target can be increased and discharge can be easily performed during the AC sputtering.

Next, oxygen doping treatment is preferably performed on the insulating film 204. Oxygen doping refers to addition of oxygen (which includes at least one of an oxygen radical, an oxygen atom, and an oxygen ion) to a bulk. Note that the term "bulk" is used in order to clarify that oxygen is added not only to a surface of a thin film but also to the inside of the thin film. In addition, the oxygen doping includes oxygen plasma doping in which oxygen that is made to be plasma is added to a bulk.

When the oxygen doping treatment is performed on the insulating film 204, a region where the amount of oxygen is larger than that in the stoichiometric composition ratio is formed in the insulating film 204. By providing such a region, oxygen can be supplied to the oxide semiconductor film and oxygen deficiency defects in the oxide semiconductor film can be reduced.

Note that in the case where an oxide semiconductor without defects (oxygen deficiency) is used, the amount of oxygen included in the insulating film 204 may be equal to that in the stoichiometric composition. However, in order to ensure reliability, for example, to suppress variation in the threshold voltage of the transistor, the insulating film 204 preferably includes oxygen at an amount which is larger than that in the stoichiometric composition, in consideration of oxygen deficiency that may occur in the oxide semiconductor film.

In this manner, the oxygen doping treatment makes it easy to obtain a gallium oxide film having a composition of $Ga_2O_{3+\alpha}$ ($\alpha>0$), which can be used as the insulating film 204, and to set a to be greater than or equal to 3.04 and less than or equal to 3.09. Alternatively, the oxygen doping treatment makes it easy to obtain an aluminum gallium oxide film having a composition of $Al_xGa_{2-x}O_{3+\alpha}$ ($1<x<2$, $\alpha>0$), which can be used as the insulating film 204. Further alternatively, the oxygen doping treatment makes it easy to obtain a gallium aluminum oxide film having a composition of $Al_xGa_{2-x}O_{3+\alpha}$ ($0<x\leq1$, $\alpha>0$), which can be used as the insulating film 204.

Figure 1B:
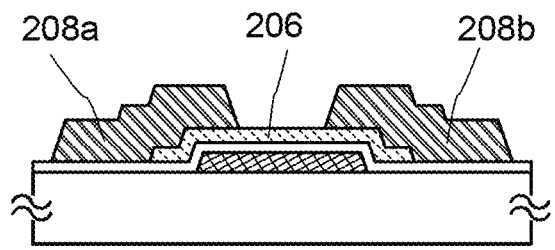

Next, an oxide semiconductor film is formed over the insulating film 204 and then processed, so that the oxide semiconductor film 206 having an island shape is formed (see FIG. 1B).

As a material used for the oxide semiconductor film 206, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material, or the like can be used. In addition, the above materials may include $SiO_2$. Here, for example, an In—Ga—Zn—O-based material means an oxide film including indium (In), gallium (Ga), and zinc (Zn), and there is no particular limitation on the composition ratio thereof. Further, the In—Ga—Zn—O-based material may include an element other than In, Ga, and Zn.

The oxide semiconductor film 206 can be a thin film formed using a material expressed by the chemical formula, $InMO_3(ZnO)_m$ ($m>0$). Here, M represents one or more metal elements selected from Ga, Al, Mn, and Co. For example, M can be Ga, Ga and Al, Ga and Mn, Ga and Co, or the like.

The thickness of the oxide semiconductor film 206 is preferably greater than or equal to 3 nm and less than or equal to 30 nm. This is because the transistor might be normally on when the oxide semiconductor film 206 is too thick (e.g., the thickness is 50 nm or more).

It is preferable to form the oxide semiconductor film by a method with which impurities such as hydrogen, water, hydroxyl group, or hydride do not easily enter the oxide semiconductor film. For example, a sputtering method or the like can be used.

In this embodiment, the oxide semiconductor film is formed by a sputtering method using an In—Ga—Zn—O-based oxide target.

As the In—Ga—Zn—O-based oxide target, for example, an oxide target having a composition ratio of $In_2O_3:Ga_2O_3$: $ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

In the case where an In—Zn—O-based material is used as the oxide semiconductor, a target to be used has a composition ratio of In:Zn=50:1 to 1:2 in atomic ratio ($In_2O_3$: ZnO=25:1 to 1:4 in a molar ratio), preferably In:Zn=20:1 to 1:1 in atomic ratio ($In_2O_3$:ZnO=10:1 to 1:2 in molar ratio), further preferably In:Zn=15:1 to 1.5:1 in atomic ratio ($In_2O_3$: ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied.

The filling rate of the oxide target is higher than or equal to 90% and lower than or equal to 100%, preferably higher than or equal to 95% and lower than or equal to 99.9%. With the use of the metal oxide target with a high filling rate, a dense oxide semiconductor film can be formed.

The atmosphere for film formation may be a rare gas (typically argon) atmosphere, an oxygen atmosphere, a mixed atmosphere of a rare gas and oxygen, or the like. Further, in order to prevent impurities such as hydrogen or water from entering the oxide semiconductor film, it is preferable to use an atmosphere of a high-purity gas from which impurities such as hydrogen or water are sufficiently removed.

For example, the oxide semiconductor film can be formed as follows.

First, the substrate 200 is held in a deposition chamber kept under reduced pressure, and heating is performed so that the substrate temperature becomes higher than 200° C. and lower than or equal to 500° C., preferably higher than 300° C. and lower than or equal to 500° C., further preferably higher than or equal to 350° C. and lower than or equal to 450° C.

Next, a high-purity gas from which impurities such as hydrogen or water are sufficiently removed is introduced into the deposition chamber while moisture remaining therein is being removed, and the oxide semiconductor film is formed over the insulating film 204 with the use of the target. In order to remove moisture remaining in the deposition chamber, an entrapment vacuum pump such as a cryopump, an ion pump, or a titanium sublimation pump is preferably used as an evacuation unit. The evacuation unit may be a turbo pump provided with a cold trap. In the deposition chamber which is evacuated with the cryopump, for example, impurities such as hydrogen or water (preferably, also a compound including a carbon atom), and the like are removed, so that the concentration of an impurity such as hydrogen or water included in the oxide semiconductor film formed in the deposition chamber can be reduced.

When the substrate temperature during film formation is low (e.g., lower than or equal to 100° C.), impurities such as hydrogen or water might enter the oxide semiconductor film; therefore, the substrate 200 is preferably heated as specified above. The substrate 200 is heated as specified above and the oxide semiconductor film is formed. When the oxide semiconductor film is formed with the substrate 200 heated as specified above, the substrate temperature is high, so that hydrogen bonds are cut by heat and hydrogen is less likely to be introduced into the oxide semiconductor film. Therefore, by forming the oxide semiconductor film with the substrate 200 heated as specified above, the concentration of impurities such as hydrogen or water in the oxide semiconductor film can be sufficiently reduced. Moreover, damage due to sputtering can be reduced.

Note that, as a method for measuring the amount of water in the oxide semiconductor film, thermal desorption spectroscopy (TDS) is given. For example, when the temperature is increased from room temperature to approximately 400° C., elimination of water, hydrogen, hydroxyl group, and the like in the oxide semiconductor film can be observed in the range of 200° C. to 300° C. approximately.

As an example of film formation conditions, the following conditions are employed: the distance between the substrate and the target is 60 mm; the pressure is 0.4 Pa; the direct-current (DC) power is 0.5 kW; the substrate temperature is 400° C.; and the deposition atmosphere is an oxygen atmosphere (the proportion of the oxygen flow rate is 100%). Note that a pulsed direct-current power source is preferably used because powder substances (also referred to as particles or dust) generated in the film formation can be reduced and the film thickness can be uniform.

Note that before the oxide semiconductor film is formed by a sputtering method, powder substances (also referred to as particles or dust) which are attached to a surface of the insulating film 204 are preferably removed by reverse sputtering in which an argon gas is introduced and plasma is generated. The reverse sputtering refers to a method in which voltage is applied to a substrate to generate plasma in the vicinity of the substrate so that a surface on the substrate side is modified. Note that instead of argon, a gas of nitrogen, helium, oxygen, or the like may be used.

The oxide semiconductor film can be processed by being etched after a mask having a desired shape is formed over the oxide semiconductor film. The above mask can be formed by a method such as photolithography. Alternatively, a method such as an inkjet method may be used to form the mask. For the etching of the oxide semiconductor film, either dry etching or wet etching may be employed. Needless to say, both of them may be employed in combination.

The oxide semiconductor film 206 formed in such a manner may be subjected to heat treatment (first heat treatment). The heat treatment further removes impurities such as hydrogen or water included in the oxide semiconductor film 206; thus, the structure of the oxide semiconductor film 206 can be improved and defect levels in the energy gap can be reduced.

The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which includes nitrogen or a rare gas (such as helium, neon, or argon) as a main component and does not include impurities such as hydrogen or water. For example, the purity of nitrogen or a rare gas such as helium, neon, or argon introduced into a heat treatment apparatus can be higher than or equal to 6N (99.9999%), preferably higher than or equal to 7N (99.99999%) (i.e., the impurity concentration is lower than or equal to 1 ppm, preferably lower than or equal to 0.1 ppm).

The heat treatment can be performed in such a manner that, for example, an object to be heated is introduced into an electric furnace in which a resistance heating element or the like is used and heated at 450° C. for one hour in a nitrogen atmosphere. The oxide semiconductor film 206 is not exposed to the air during the heat treatment so that entry of impurities such as hydrogen or water can be prevented.

The above heat treatment can also be referred to as dehydration treatment, dehydrogenation treatment, or the like because of its effect of removing impurities such as hydrogen or water. The heat treatment can be performed at the timing, for example, after the oxide semiconductor film is formed. Such dehydration treatment or dehydrogenation treatment may be conducted once or plural times.

Next, treatment for supplying oxygen (also referred to as oxygen doping treatment, or the like) is preferably performed on the oxide semiconductor film 206. As the treatment for supplying oxygen, heat treatment in an oxygen atmosphere (second heat treatment), treatment using oxygen plasma, and the like are given. Alternatively, oxygen may be added by performing irradiation with an oxygen ion accelerated by an electric field.

Note that an electric bias may be applied to the substrate in order to add oxygen more favorably.

By performing the oxygen doping treatment on the oxide semiconductor film 206, oxygen can be included in the oxide semiconductor film 206 or/and in the vicinity of the interface of the oxide semiconductor film 206. In that case, the amount of oxygen is preferably larger than that in the stoichiometric composition ratio of the oxide semiconductor film.

Note that, heat treatment may be performed on the oxide semiconductor film 206 which has been subjected to the oxygen doping treatment. The heat treatment is performed at higher than or equal to 250° C. and lower than or equal to 700° C., preferably higher than or equal to 400° C. and lower than or equal to 600° C. or lower than the strain point of the substrate.

Through the heat treatment, water, hydroxide (OH), and the like generated by reaction between oxygen and an oxide semiconductor material can be removed from the oxide semiconductor film. By this heat treatment, hydrogen or the like that has entered the oxide semiconductor film 206 or the like during the above oxygen doping treatment can also be removed. The heat treatment may be performed in an atmosphere of nitrogen, oxygen, ultra-dry air (air where the moisture content is 20 ppm (−55° C. by conversion into a dew point) or less, preferably 1 ppm or less, further preferably 10 ppb or less when measurement is performed using a dew-point meter of a cavity ring down laser spectroscopy (CRDS) system), a rare gas (such as argon or helium), or the like in which water, hydrogen, and the like are sufficiently reduced. In particular, the heat treatment is preferably performed in an atmosphere including oxygen. Further, the purity of nitrogen, oxygen, or a rare gas introduced into a heat treatment apparatus is preferably higher than or equal to 6N (99.9999%)

(i.e., the impurity concentration is lower than or equal to 1 ppm), further preferably higher than or equal to 7N (99.99999%) (i.e., the impurity concentration is lower than or equal to 0.1 ppm).

Note that the timing of the oxygen doping treatment is not limited to the timing described above. However, the oxygen doping treatment is preferably performed after the heat treatment for dehydration or the like.

As described above, the heat treatment for dehydration or the like, and the oxygen doping treatment or the heat treatment for supply of oxygen are performed, whereby the oxide semiconductor film 206 can be highly purified so as to include elements (impurity elements) that are not main components of the oxide semiconductor film 206 as few as possible. The highly purified oxide semiconductor film 206 includes extremely few carriers derived from a donor.

Next, a conductive film for forming the source electrode and the drain electrode (including a wiring formed in the same layer as the source electrode and the drain electrode) is formed over the insulating film 204 and the oxide semiconductor film 206 and then processed, so that the source electrode 208a and the drain electrode 208b are formed (see FIG. 1B). Note that a channel length L of the transistor is determined by the distance between the edges of the source electrode 208a and the drain electrode 208b which are formed here.

As the conductive film used for the source electrode 208a and the drain electrode 208b, for example, a metal film including an element selected from aluminum, chromium, copper, tantalum, titanium, molybdenum, and tungsten; a metal nitride film including any of the above elements as a component (a titanium nitride film, a molybdenum nitride film, or a tungsten nitride film); or the like can be used. The source electrode 208a and the drain electrode 208b may have a single-layer structure or a stacked-layer structure. A high-melting-point metal film of titanium, molybdenum, tungsten, or the like or a metal nitride film thereof (a titanium nitride film, a molybdenum nitride film, or a tungsten nitride film) may be stacked on one or both of top and bottom sides of a metal film of aluminum, copper, or the like.

Alternatively, the conductive film used for the source electrode 208a and the drain electrode 208b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials including silicon oxide can be used.

The conductive film can be processed by being etched after a mask having a desired shape is formed over the conductive film. As the above mask, a resist mask or the like can be used. Ultraviolet light, KrF laser light, ArF laser light, or the like is preferably used for light exposure at the time of forming the resist mask.

In the case where the channel length L is less than 25 nm, the light exposure at the time of forming the resist mask is preferably performed using, for example, extreme ultraviolet light having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

An etching step may be performed using a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, the manufacturing process can be simplified.

Note that in the etching of the conductive film, part of the oxide semiconductor film 206 is etched, so that the oxide semiconductor film 206 has a groove (a recessed portion) in some cases.

After that, by plasma treatment using a gas such as $N_2O$, $N_2$, or Ar, impurities such as hydrogen or water attached to a surface of an exposed portion of the oxide semiconductor film 206 may be removed.

Next, the insulating film 210 is formed so as to cover the source electrode 208a and the drain electrode 208b and be partly in contact with the oxide semiconductor film 206, and the insulating film 212 is formed over and in contact with the insulating film 210. Then, a resist mask 214 is formed over the insulating film 212 (see FIG. 1C).

The insulating film 210 functions as a protective film of the transistor 110. The insulating film 210 can be formed using a material including gallium oxide. The material including gallium oxide may further include aluminum oxide; that is, a material including aluminum gallium oxide or gallium aluminum oxide, or the like may be used. In addition, the thickness of the insulating film 210 is preferably greater than or equal to 10 nm and less than 100 nm.

Here, a gallium oxide film used as the insulating film 210 can have a composition of $Ga_2O_{3+\alpha}$ ($\alpha>0$). It is preferable that a be greater than or equal to 3.04 and less than or equal to 3.09. Alternatively, an aluminum gallium oxide film used as the insulating film 210 preferably has a composition of $Al_xGa_{2-x}O_{3+\alpha}$ ($1<x<2$, $\alpha>0$). Further alternatively, a gallium aluminum oxide film used as the insulating film 210 preferably has a composition of $Al_xGa_{2-x}O_{3+\alpha}$ ($0<x\leq1$, $\alpha>0$) by being doped with oxygen.

The insulating film 210 is preferably formed by a method with which impurities such as hydrogen or water do not enter the insulating film 210. This is because, when impurities such as hydrogen or water are included in the insulating film 210, the impurities such as hydrogen or water enter the oxide semiconductor film formed later or oxygen in the oxide semiconductor film is extracted by the impurities such as hydrogen or water, so that a back channel of the oxide semiconductor film might have lower resistance (have n-type conductivity) and a parasitic channel might be formed. Therefore, the insulating film 210 is preferably formed so as to include impurities such as hydrogen or water as few as possible. For example, the insulating film 210 is preferably formed by a sputtering method. A high-purity gas from which impurities such as hydrogen or water are removed is preferably used as a sputtering gas used for film formation.

Examples of the sputtering method include a DC sputtering method in which a direct current power source is used, a pulsed DC sputtering method in which a direct bias is applied in a pulsed manner, an AC sputtering method, and the like.

Note that the insulating film 210 is preferably formed while the substrate 200 is being heated.

In many cases, an oxide semiconductor material used for the oxide semiconductor film includes gallium. Therefore, the insulating film 210 which is in contact with the oxide semiconductor film is formed using a material including gallium oxide, whereby a favorable condition can be maintained at an interface between the oxide semiconductor film and the insulating film 210. For example, by providing the oxide semiconductor film in contact with the insulating film 210 including gallium oxide, an accumulation of hydrogen at an interface between the oxide semiconductor film and the insulating film can be reduced. This is because a material including gallium oxide is compatible with an oxide semiconductor material.

Note that, in the case where an element belonging to the same group as a constituent element of the oxide semiconductor is used for the insulating film 210, a similar effect can be obtained. That is, it is also effective to additionally use a material including aluminum oxide or the like for the insulating film 210. Aluminum oxide tends to prevent water penetration; therefore, it is preferable to use the material including aluminum oxide in the optic of preventing water from entering the oxide semiconductor film. For example, a material including gallium and aluminum, such as aluminum gallium oxide (or gallium aluminum oxide) may be used for the insulating film 210. In this case, both the effect resulting from inclusion of gallium and the effect resulting from inclusion of aluminum can be obtained, which is preferable. By providing the oxide semiconductor film in contact with an insulating film including aluminum gallium oxide, for example, water can be prevented from entering the oxide semiconductor film and an accumulation of hydrogen at an interface between the oxide semiconductor film and the insulating film can be sufficiently reduced.

Note that oxygen doping treatment may be performed on the insulating film 210 here. Oxygen doping refers to addition of oxygen (which includes at least one of an oxygen radical, an oxygen atom, and an oxygen ion) to a bulk. Note that the term "bulk" is used in order to clarify that oxygen is added not only to a surface of a thin film but also to the inside of the thin film. In addition, the oxygen doping includes oxygen plasma doping in which oxygen that is made to be plasma is added to a bulk.

When the oxygen doping treatment is performed on the insulating film 210, a region where the amount of oxygen is larger than that in the stoichiometric composition ratio is formed in the insulating film 210. By providing such a region, oxygen can be supplied to the oxide semiconductor film and oxygen deficiency defects in the oxide semiconductor film can be reduced.

Note that in the case where an oxide semiconductor without defects (oxygen deficiency) is used, the amount of oxygen included in the insulating film 210 may be equal to that in the stoichiometric composition. However, in order to ensure reliability, for example, to suppress variation in the threshold voltage of the transistor, the insulating film 210 preferably includes oxygen at an amount which is larger than that in the stoichiometric composition, in consideration of oxygen deficiency that may occur in the oxide semiconductor film.

In this manner, the oxygen doping treatment makes it easy to obtain a gallium oxide film having a composition of $Ga_2O_{3+\alpha}$ ($\alpha>0$), which can be used as the insulating film 210, and to set a to be greater than or equal to 3.04 and less than or equal to 3.09. Alternatively, the oxygen doping treatment makes it easy to obtain an aluminum gallium oxide film having a composition of $Al_xGa_{2-x}O_{3+\alpha}$ ($1<x<2$, $\alpha>0$), which can be used as the insulating film 210. Further alternatively, the oxygen doping treatment makes it easy to obtain a gallium aluminum oxide film having a composition of $Al_xGa_{2-x}O_{3+\alpha}$ ($0<x\leq1$, $\alpha>0$), which can be used as the insulating film 210.

The insulating film 212 also functions as a protective film of the transistor 110. The insulating film 212 can be formed by a plasma CVD method using a material such as silicon oxide, silicon nitride, silicon oxynitride, or silicon nitride oxide or a sputtering method, for example. In addition, the thickness of the insulating film 212 is larger than the thickness of the insulating film 210 and is preferably greater than or equal to 100 nm and less than or equal to 300 nm.

The insulating film 210 and the insulating film 212 having a larger thickness than the insulating film 210 are stacked in this manner, so that a favorable condition can be maintained at the interface between the oxide semiconductor film and the protective film by the insulating film 210 including gallium oxide and an adequate thickness for the protective film of the transistor 110 can be secured by the insulating film 212. Further, by thus increasing the thickness of the stack of the insulating film 210 and the insulating film 212, which functions as the protective film of the transistor 110, parasitic capacitance between the transistor and a wiring formed in a subsequent step can be reduced.

The resist mask 214 can be formed using a material such as a photosensitive resin by a photolithography method. Here, if the insulating film 210 including gallium oxide is subjected to wet treatment using a developer or the like, the region which is in the insulating film 210 and is needed in design might be dissolved. However, by stacking the insulating film 210 and the insulating film 212 as described in this embodiment and providing the resist mask 214 over the insulating film 212, the resist mask 214 can be formed without the insulating film 210 including gallium oxide being in contact with the developer. Thus, the resist mask 214 can be formed without a possibility that the region which is in the insulating film 210 including gallium oxide and is needed in design is dissolved.

Figure 1C:
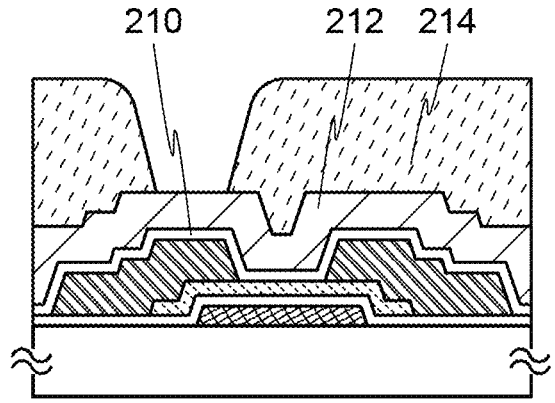
Figure 1D:
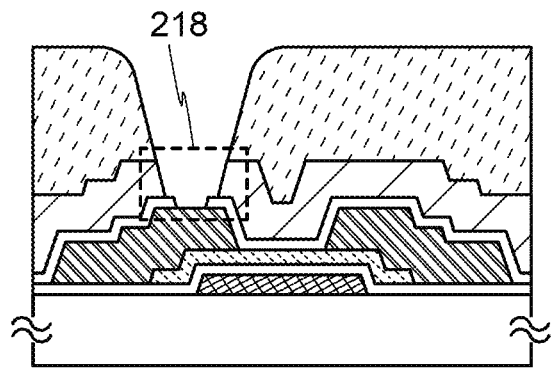

Next, dry etching is performed on the insulating film 210 and the insulating film 212 with the use of the resist mask 214, so that the contact hole 218 is formed (see FIG. 1D).

If wet treatment such as wet etching is performed here, the region which is in the insulating film 210 including gallium oxide and is needed in design might be dissolved. Therefore, particularly in the case of miniaturizing the semiconductor device, it is extremely difficult to process the insulating film 210 including gallium oxide by wet etching to have a designed size.

Thus, the insulating film 210 and the insulating film 212 are processed by dry etching in this embodiment. For the dry etching, a parallel plate reactive ion etching (RIE) method, an inductively coupled plasma (ICP) etching method, or the like can be used. Etching conditions (such as the amount of power applied to a coil-shaped electrode, the amount of power applied to an electrode on a substrate side, and the temperature of the electrode on the substrate side) may be set as appropriate in accordance with the material so that the films can be etched into desired shapes.

As an etching gas that can be used for the dry etching, a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)); octafluorocyclobutane ($C_4F_8$); any of these gases to which a rare gas such as helium (He) or argon (Ar) is added; and the like can be given. By etching the insulating film 210 and the insulating film 212 with the use of such a gas including fluorine, etching can be performed such that etching selectivity of the insulating films with respect to the source electrode 208a is high. For example, conditions of etching using an ICP etching method are set as follows: 7.5 sccm of trifluoromethane and 142.5 sccm of helium are used as an etching gas; the power applied to the coil-shaped electrode is 475 W; the power applied to the electrode on the substrate side is 300 W; the pressure is 5.5 Pa; and the temperature of a lower electrode is 70° C.

Further, a gas including chlorine (a chlorine-based gas such as chlorine ($Cl_2$), boron trichloride ($BCl_3$), silicon tetrachloride ($SiCl_4$), or carbon tetrachloride ($CCl_4$)) or the like may be used. In the case where an insulating film including gallium oxide and aluminum oxide is used as the insulating film 210, the insulating film 210 can be easily etched using such a gas including chlorine.

In the dry etching, the etching rate of the insulating film 210 including gallium oxide tends to be lower than the etching rate of the insulating film 212. Accordingly, the diameter of the contact hole 218 in the insulating film 210 can be easily made smaller than the diameter of the contact hole 218 in the insulating film 212 as illustrated in FIG. 1D. That is, the contact hole 218 can have a stepped shape. By forming the contact hole 218 having such a stepped shape, coverage with the wiring 216 formed later can be improved. Alternatively, the contact hole 218 may be formed to have a shape where the diameter of the contact hole 218 in the insulating film 210 is substantially equal to the diameter of the contact hole 218 in the insulating film 212 by setting etching conditions (such as an etching gas, the etching time, and the temperature) as appropriate so that the insulating film 210 and the insulating film 212 have the same or substantially the same etching rate.

By performing dry etching on the insulating film 210 and the insulating film 212 in this manner, the contact hole 218 can be formed in the insulating film 210 and the insulating film 212 without a possibility that the region which is in the insulating film 210 including gallium oxide and is needed in design is dissolved.

Figure 1E:
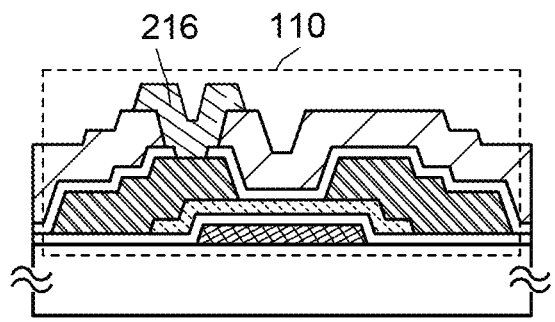

Next, the resist mask 214 is removed by ashing using oxygen plasma, and the wiring 216 is formed so as to be electrically connected to the source electrode 208a through the contact hole 218 (see FIG. 1E).

Here, if an alkali stripper solution is used for the removal of the resist mask 214, the region which is in the insulating film 210 including gallium oxide and is needed in design might be dissolved. Therefore, in this embodiment, the resist mask 214 is removed by ashing using oxygen plasma.

The ashing treatment using oxygen plasma is performed in an oxygen atmosphere in such a manner that oxygen is made to be plasma by high frequency power or the like and the resist mask 214 is decomposed and removed by the oxygen that is made to be plasma. By removing the resist mask 214 in this manner, the resist mask 214 can be removed without a possibility that the region which is in the insulating film 210 including gallium oxide and is needed in design is dissolved. For example, conditions of the ashing treatment using oxygen plasma, in which an ICP apparatus is used, are set as follows: 300 sccm of an oxygen gas is used; the power of an RF power source is 1800 W; the pressure is 66.5 Pa; and the treatment duration is 180 seconds.

By the ashing treatment using oxygen plasma, the resist mask 214 can be removed without generation of a residue of the resist mask 214 or a reaction product of the residue. Accordingly, a surface of the insulating film 212 can be kept clean after the resist mask 214 is removed.

The wiring 216 is electrically connected to the source electrode 208a of the transistor 110 and functions as a so-called source wiring. The wiring 216 can be formed using a material and a method similar to those of the source electrode 208a and the drain electrode 208b.

As described above, even when an insulating film formed using a material including gallium oxide is used, the insulating film is not directly subjected to wet treatment; thus, the transistor 110 can be formed without a possibility that a region which is in the insulating film including gallium oxide and is needed in design is dissolved (see FIG. 1E).

Note that in the manufacturing process of the transistor 110 in FIGS. 1A to 1E, the step of electrically connecting the wiring 216 to the source electrode 208a is described; however, the disclosed invention is not limited to this. For example, a wiring formed over the insulating film 212 may be electrically connected to the drain electrode 208b by a similar method. In the case where the transistor is used for a pixel portion, a pixel electrode may be electrically connected to the source electrode 208a or the drain electrode 208b by a similar method. In addition, a wiring formed over the insulating film 212 may be electrically connected to the gate electrode (or a wiring formed in the same layer as the gate electrode) by a similar method.

Here, a step in which a wiring 222 that is electrically connected to the gate electrode 202 (or a wiring formed in the same layer as the gate electrode 202) illustrated in FIGS. 1A to 1E through a contact hole 224 is formed over the insulating film 212 will be described with reference to FIGS. 2A to 2C. Here, the gate electrode 202 and the wiring 222 are electrically connected to each other in a region where the gate electrode 202 does not overlap with the oxide semiconductor film 206, the source electrode 208a, or the drain electrode 208b.

Figure 2A:
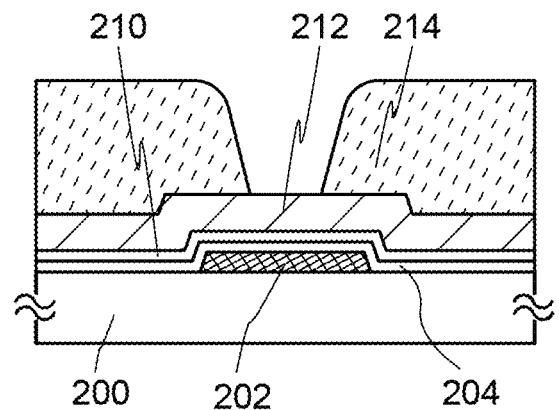
FIGS. 2A to 2C illustrate an example of a manufacturing process of a semiconductor device.

First, steps similar to those comprised in the manufacturing process of the transistor 110 are performed up to and including the step illustrated in FIG. 1C; thus, the resist mask 214 is formed so that the contact hole 224 can be formed in a region where the gate electrode 202 does not overlap with the oxide semiconductor film 206, the source electrode 208a, and the drain electrode 208b (see FIG. 2A).

Figure 2B:
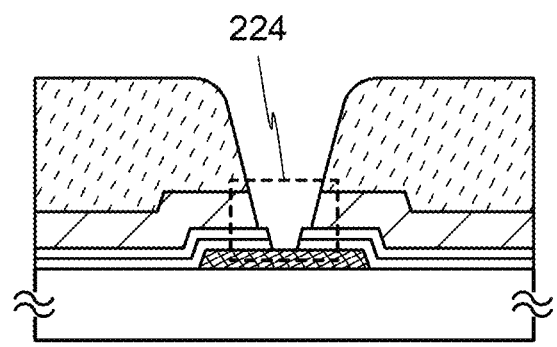

Next, dry etching is performed on the insulating film 204, the insulating film 210, and the insulating film 212 by a method similar to that used in the step illustrated in FIG. 1D, so that the contact hole 224 is formed (see FIG. 2B). Here, the insulating film 204 is also etched in the same step, which is different from the step illustrated in FIG. 1D; when the insulating film 204 is formed using a material similar to that of the insulating film 210 or the insulating film 212, the insulating film 204 can be etched in a manner similar to that of the insulating film 210 or the insulating film 212.

Figure 2C:
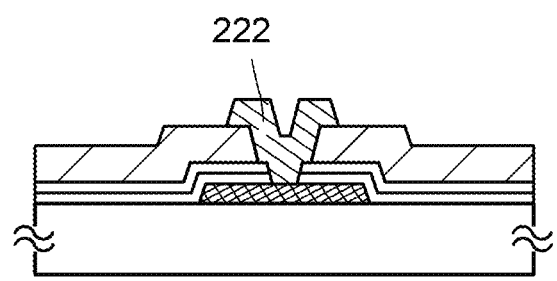

Then, the resist mask 214 is removed by ashing using oxygen plasma by a method similar to that used in the step illustrated in FIG. 1E, and the wiring 222 is formed so as to be electrically connected to the gate electrode 202 through the contact hole 224 (see FIG. 2C). Here, the wiring 222 functions as a so-called gate wiring and can be formed using a method and a material similar to those of the wiring 216 illustrated in FIG. 1E.

As described above, even when an insulating film formed using a material including gallium oxide is used, the insulating film is not directly subjected to wet treatment; thus, the wiring 222 which is electrically connected to the gate electrode 202 (including the wiring formed in the same layer as the gate electrode 202) through the contact hole 224 can be formed over the insulating film 212 without a possibility that a region which is in the insulating film including gallium oxide and is needed in design is dissolved.

In addition, as the manufacturing process of the transistor 110 in FIGS. 1A to 1E, a process for manufacturing the bottom-gate transistor 110 in which the gate electrode 202 is provided below the oxide semiconductor film 206 to overlap therewith is described; however, the disclosed invention is not limited to this. For example, a top-gate transistor in which a gate electrode is provided over an oxide semiconductor film to overlap therewith may be manufactured by a similar method.

Here, an example of a manufacturing process of a top-gate transistor 310 illustrated in FIG. 3E will be described with reference to FIGS. 3A to 3E. Here, the transistor 310 includes, over a substrate 400, an oxide semiconductor film 406, a source electrode 408a, a drain electrode 408b, an insulating film 410, a gate electrode 402, an insulating film 412, and a wiring 416. In the transistor illustrated in FIG. 3E, the insulating film 410 including gallium oxide is provided in contact with the oxide semiconductor film 406, and the insulating film 412 is provided over and in contact with the insulating film 410 including gallium oxide. In addition, the wiring 416 is electrically connected to the source electrode 408a through a contact hole 418 formed in the insulating film 412 and the insulating film 410.

First, an oxide semiconductor film for forming the oxide semiconductor film 406 is formed over the substrate 400 and then processed into an island shape, so that the oxide semiconductor film 406 is formed. After that, a conductive film for forming the source electrode and the drain electrode (including a wiring formed in the same layer as the source electrode and the drain electrode) is formed over and in contact with the oxide semiconductor film 406. The conductive film is processed, so that the source electrode 408a and the drain electrode 408b are formed (see FIG. 3A). The substrate 400, the oxide semiconductor film 406, the source electrode 408a, and the drain electrode 408b can be formed using materials and methods similar to those of the substrate 200, the oxide semiconductor film 206, the source electrode 208a, and the drain electrode 208b illustrated in FIGS. 1A to 1E.

Note that a base insulating film is preferably formed over the substrate 400 before the oxide semiconductor film 406 is formed. The base insulating film can be formed using a material and a method similar to those of the insulating film 204 illustrated in FIGS. 1A to 1E, and is preferably formed using a material including gallium oxide or a material including gallium oxide and aluminum oxide. Thus, a favorable condition can be maintained at an interface where the base insulating film is in contact with the oxide semiconductor film.

Next, the insulating film 410 is formed so as to cover the oxide semiconductor film 406, the source electrode 408a, and the drain electrode 408b. Then, a conductive film for forming the gate electrode (including a wiring formed in the same layer as the gate electrode) is formed and then processed, so that the gate electrode 402 is formed to overlap with the oxide semiconductor film 406 (see FIG. 3B). The gate electrode 402 can be formed using a material and a method similar to those of the gate electrode 202 illustrated in FIGS. 1A to 1E. The insulating film 410 can be formed using a material and a method similar to those of the insulating film 210 illustrated in FIGS. 1C to 1E. Further, the insulating film 410 may have a stacked-layer structure including an insulating film formed using a material similar to that of the insulating film 204 illustrated in FIGS. 1A to 1E. In this manner, by using a material including gallium oxide for the insulating film 410, a favorable condition can be maintained at an interface where the insulating film 410 is in contact with the oxide semiconductor film.

Figure 3A:
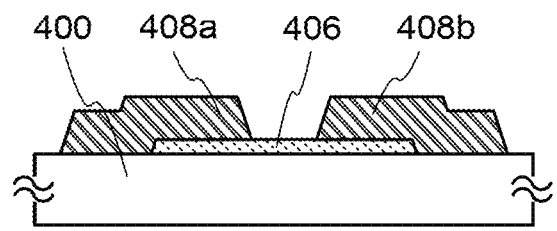
FIGS. 3A to 3E illustrate an example of a manufacturing process of a semiconductor device.
Figure 3B:
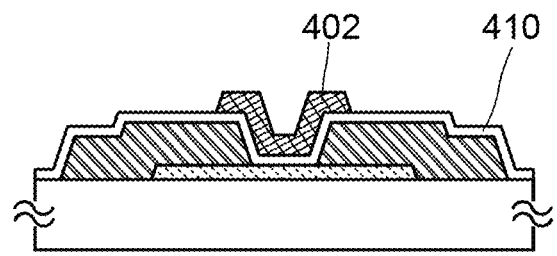
Figure 3C:
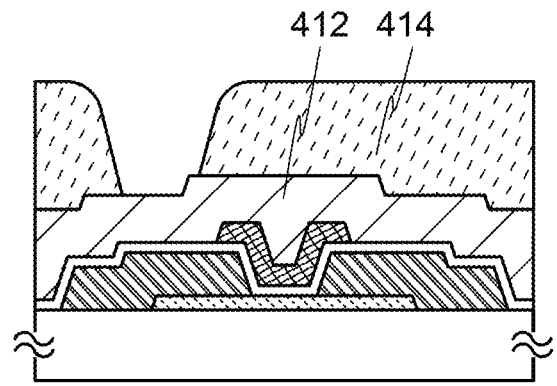

Next, the insulating film 412 is formed so as to cover the gate electrode 402 and insulating film 410, and then a resist mask 414 is formed over the insulating film 412 (see FIG. 3C). The insulating film 412 and the resist mask 414 can be formed using materials and methods similar to those of the insulating film 212 and the resist mask 214 illustrated in FIGS. 1C to 1E.

Figure 3D:
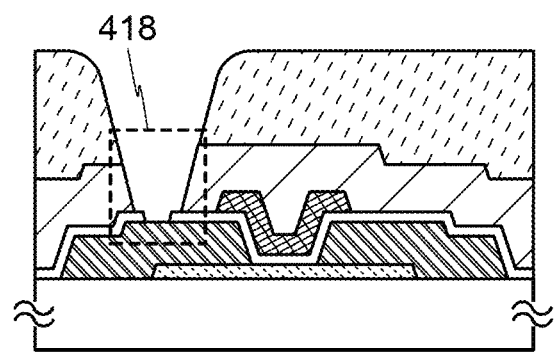

Next, dry etching is performed on the insulating film 410 and the insulating film 412 with the use of the resist mask 414, so that the contact hole 418 is formed (see FIG. 3D). The contact hole 418 can be formed by a method similar to that of the contact hole 218 illustrated in FIGS. 1D and 1E.

Figure 3E:
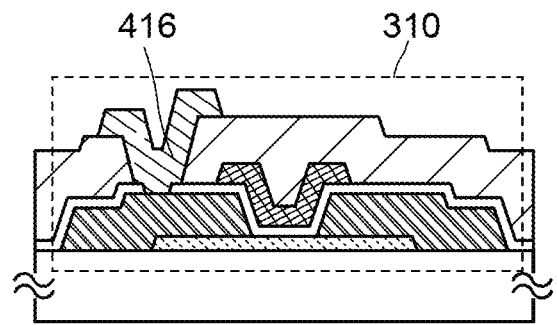

Then, the resist mask 414 is removed by ashing using oxygen plasma, and the wiring 416 is formed so as to be electrically connected to the source electrode 408a through the contact hole 418 (see FIG. 3E). The resist mask 414 can be removed by a method similar to that used in the removal of the resist mask 214 illustrated in the FIGS. 1C and 1D. The wiring 416 can be formed using a material and a method similar to those of the wiring 216 illustrated in FIG. 1E.

As described above, even when an insulating film formed using a material including gallium oxide is used, the insulating film is not directly subjected to wet treatment; thus, the transistor 310 can be formed without possibility that a region in the insulating film including gallium oxide and needed in design is dissolved (see FIG. 3E).

As the manufacturing process of the transistor illustrated in FIGS. 1A to 1E or FIGS. 3A to 3E, a process for manufacturing the transistor in which at least a top surface of the oxide semiconductor film is electrically connected to the source electrode or the drain electrode is described; however, the disclosed invention is not limited to this. For example, a transistor in which at least a bottom surface of an oxide semiconductor film is electrically connected to a source electrode or a drain electrode may be manufactured by a similar method.

In this embodiment, etching treatment is performed on the insulating films obtained by providing, over and in contact with the insulating film including gallium oxide, another insulating film; however, the disclosed invention is not limited to this.

As described in this embodiment, an insulating film which is in contact with an oxide semiconductor film is formed using a material including gallium oxide, whereby a favorable condition can be maintained at an interface between the oxide semiconductor film and the insulating film.

In an etching step of the insulating film formed using a material including gallium oxide, the insulating film is not directly subjected to wet treatment; thus, the insulating film including gallium oxide can be etched without possibility that a region in the insulating film including gallium oxide and needed in design is dissolved.

Accordingly, a semiconductor device including an oxide semiconductor and having stable electric characteristics can be provided. Therefore, a semiconductor device having high reliability can be provided.

The structures, methods, and the like described in this embodiment can be combined as appropriate with any of the structures, methods, and the like described in the other embodiments.

Embodiment 2

A semiconductor device having a display function (also referred to as a display device) can be manufactured using the transistor described in Embodiment 1. Moreover, part or all of a driver circuit which includes the transistor can be formed over a substrate where a pixel portion is formed, whereby a system-on-panel can be obtained.

Figure 5A:
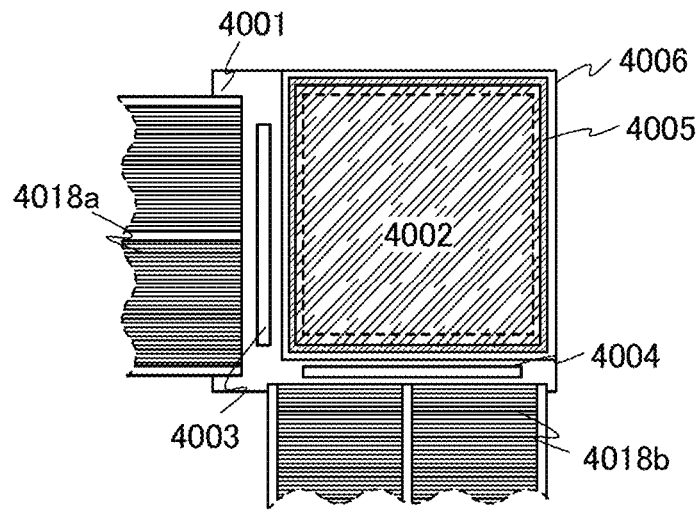
FIGS. 5A to 5C illustrate embodiments of a semiconductor device.

In FIG. 5A, a sealant 4005 is provided so as to surround a pixel portion 4002 provided over a first substrate 4001, and the pixel portion 4002 is sealed by using a second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied from flexible printed circuits (FPCs) 4018a and 4018b to the signal line driver circuit 4003 and the scan line driver circuit 4004, which are separately formed, and the pixel portion 4002.

Figure 5B:
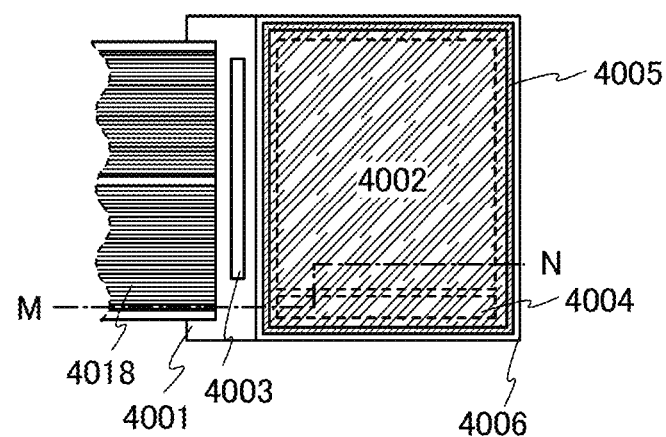
Figure 5C:
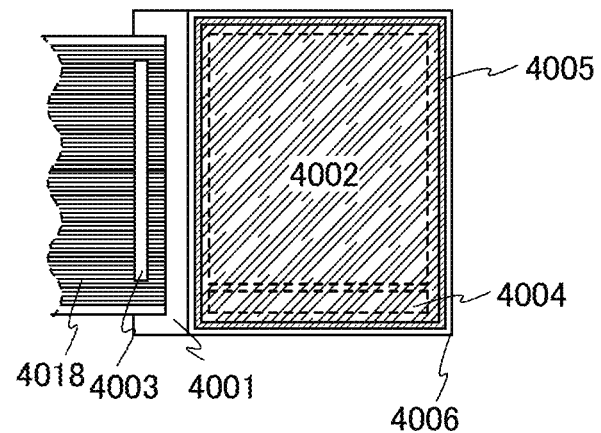

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, various signals and potentials are supplied from an FPC 4018 to the separately formed signal line driver circuit 4003, the scan line driver circuit 4004, and the pixel portion 4002.

Although FIGS. 5B and 5C each illustrate an example in which the signal line driver circuit 4003 is formed separately and mounted on the first substrate 4001, the disclosed invention is not limited to this structure. The scan line driver circuit may be separately formed and then mounted, or only part of the signal line driver circuit or part of the scan line driver circuit may be separately formed and then mounted.

Note that there is no particular limitation on the connection method of a separately formed driver circuit, and a chip on glass (COG) method, a wire bonding method, a tape automated bonding (TAB) method, or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which the display element is sealed, and a module in which an IC including a controller or the like is mounted on the panel.

Note that a display device in this specification means an image display device, a display device, or a light source (including a lighting device). Further, the display device includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors, to which the transistor described in Embodiment 1 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

Figure 6:
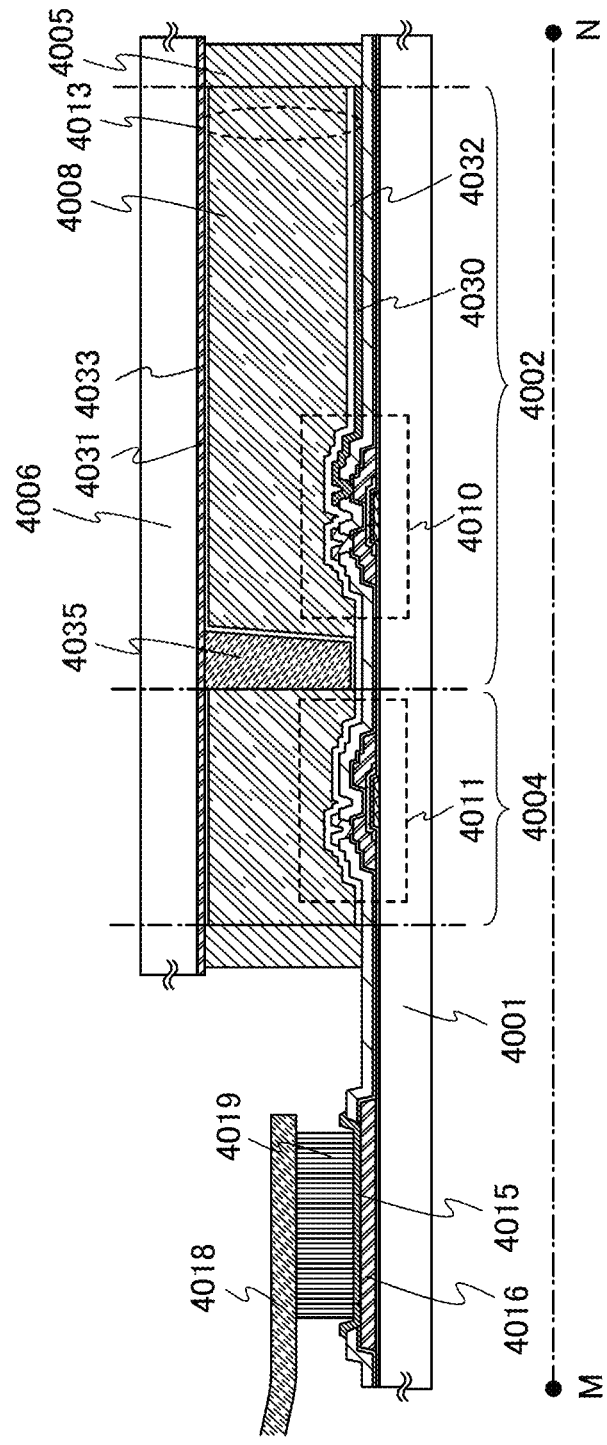
FIG. 6 illustrates one embodiment of a semiconductor device.
Figure 7:
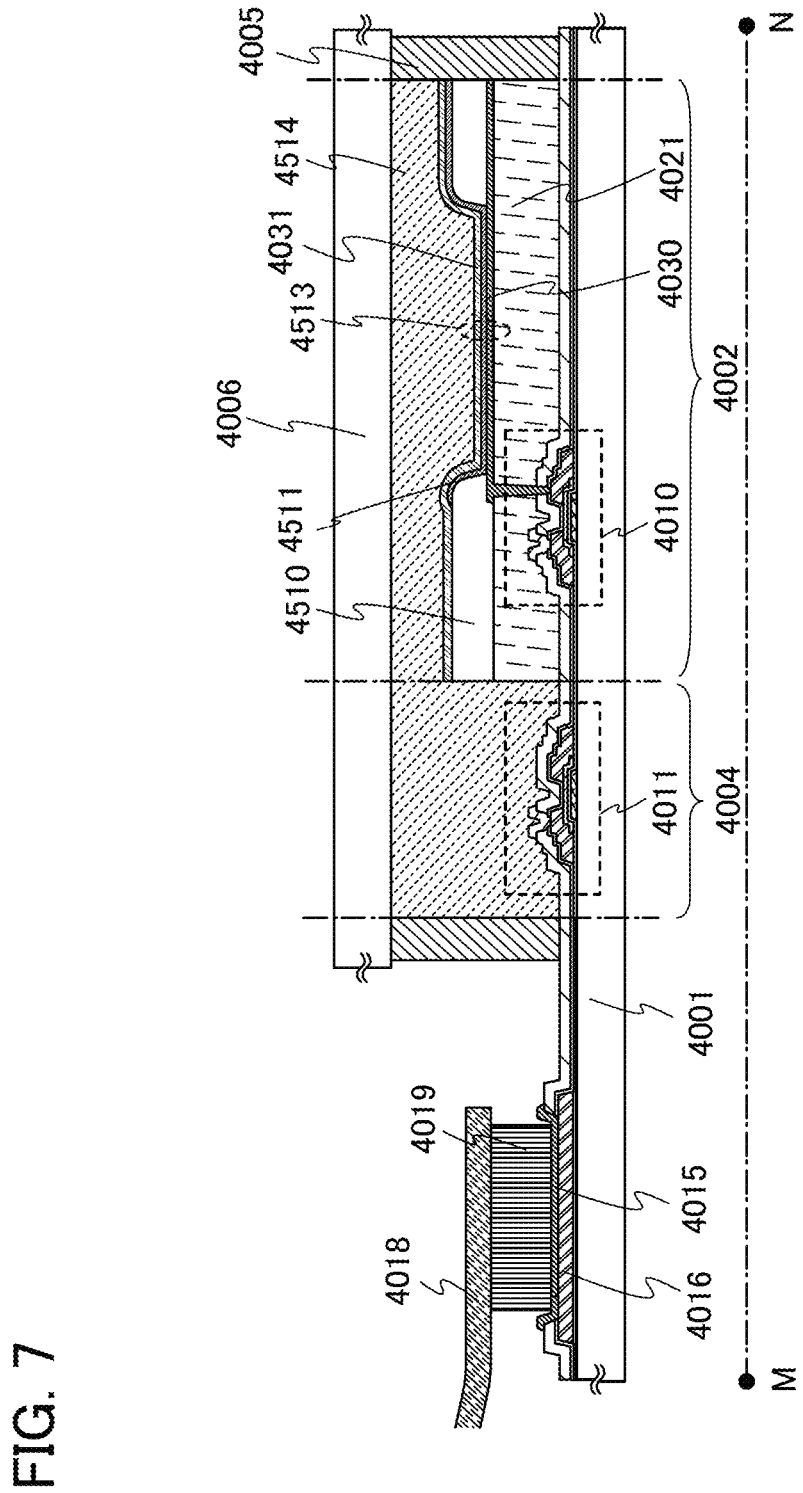
FIG. 7 illustrates one embodiment of a semiconductor device.
Figure 8:
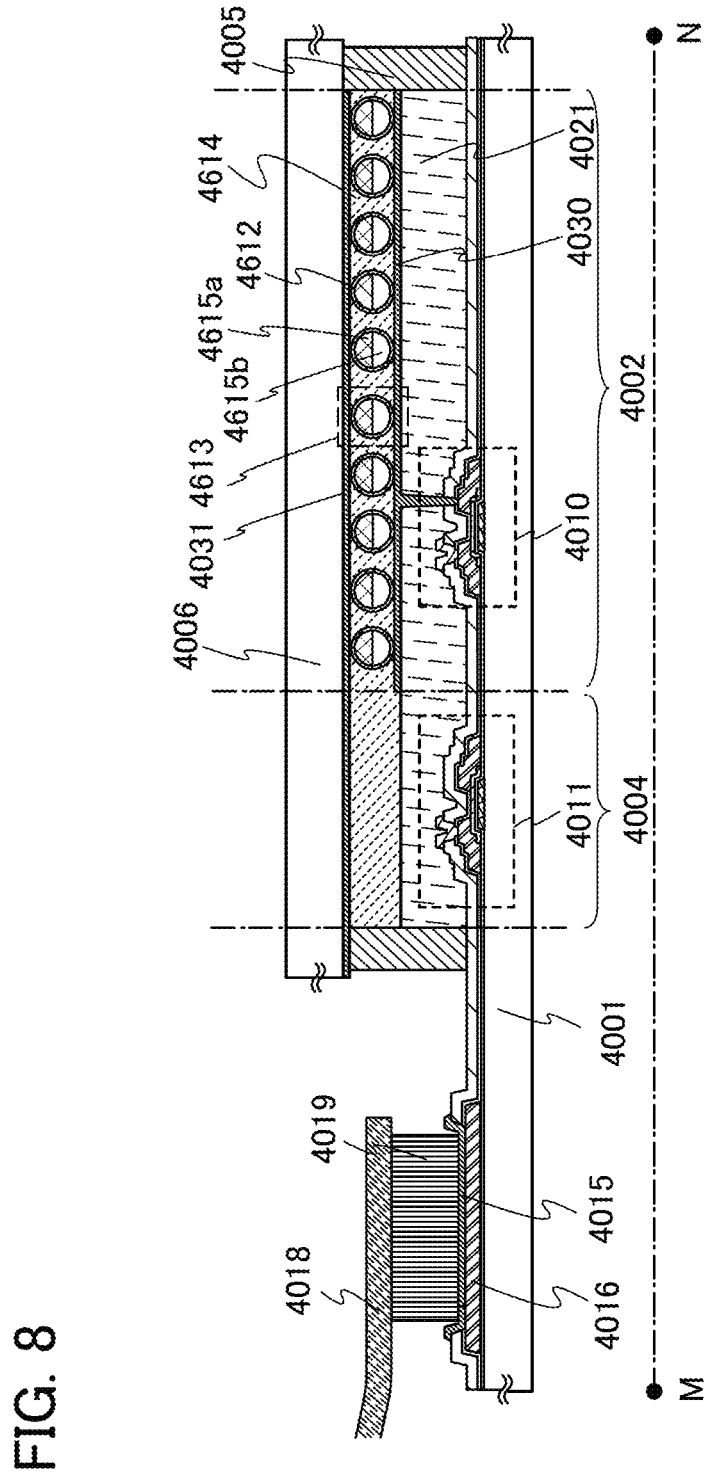
FIG. 8 illustrates one embodiment of a semiconductor device.

One embodiment of a semiconductor device will be described with reference to FIG. 6, FIG. 7, and FIG. 8. FIG. 6, FIG. 7, and FIG. 8 correspond to cross-sectional views along line M-N in FIG. 5B.

As illustrated in FIG. 6, FIG. 7, and FIG. 8, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030. The terminal electrode 4016 is formed using the same conductive film as source electrodes and drain electrodes of a transistor 4010 and a transistor 4011.

The pixel portion 4002 and the scan line driver circuit 4004 which are provided over the first substrate 4001 include a plurality of transistors. In FIG. 6, FIG. 7, and FIG. 8, the transistor 4010 included in the pixel portion 4002 and the transistor 4011 included in the scan line driver circuit 4004 are illustrated as an example.

In this embodiment, the transistor described in Embodiment 1 can be applied to the transistor 4010 and the transistor 4011. Variation in electric characteristics of the transistor 4010 and the transistor 4011 is suppressed and the transistor 4010 and the transistor 4011 are electrically stable. Accordingly, semiconductor devices having high reliability can be provided as the semiconductor devices of this embodiment illustrated in FIG. 6, FIG. 7, and FIG. 8.

The transistor 4010 provided in the pixel portion 4002 is electrically connected to a display element to form a display panel. A variety of display elements can be used as the display element without particular limitation as long as display can be performed.

An example of a liquid crystal display device using a liquid crystal element as the display element is illustrated in FIG. 6. In FIG. 6, a liquid crystal element 4013 which is a display element includes the first electrode layer 4030, a second electrode layer 4031, and a liquid crystal layer 4008. An insulating film 4032 and an insulating film 4033 which function as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 positioned therebetween.

A columnar spacer denoted by reference numeral 4035 is obtained by selective etching of an insulating film and is provided in order to control the thickness (a cell gap) of the liquid crystal layer 4008. Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on requirements.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated only in a narrow temperature range, a liquid crystal composition in which 5 wt. % or more of a chiral agent is mixed is used for the liquid crystal layer in order to improve the temperature range. The liquid crystal composition which includes liquid crystal exhibiting a blue phase and a chiral agent has a short response time of 1 millisecond or less, has optical isotropy, which makes an alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is $1\times10^9$ Ω·cm or higher, preferably $1\times10^{11}$ Ω·cm or higher, further preferably $1\times10^{12}$ Ω·cm or higher. The value of the specific resistivity in this specification is measured at 20° C.

The size of a storage capacitor formed in the liquid crystal display device is set considering the leakage current or the like of the transistor provided in the pixel portion so that electric charge can be held for a predetermined period. By using the transistor including the high-purity oxide semiconductor film, it is satisfactory to provide a storage capacitor having a capacitance that is ⅓ or less, preferably ⅕ or less with respect to liquid crystal capacitance of each pixel.

In the transistor including the highly purified oxide semiconductor film used in this embodiment, the current in an off state (the off-state current) can be reduced. Therefore, an electrical signal such as an image signal can be held for a longer period, and a writing interval can be set longer when the power is on. Accordingly, frequency of refresh operation can be reduced, which leads to an effect of suppressing power consumption.

In addition, the transistor including the highly purified oxide semiconductor film used in this embodiment can have relatively high field-effect mobility and thus is capable of high speed operation. Therefore, by using the transistor in the pixel portion of the liquid crystal display device, a high-quality image can be provided. Further, since the transistor can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling the alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer including a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element is described here as a light-emitting element.

In order to extract light emitted from the light-emitting element, at least one of a pair of electrodes is transparent. Then, a transistor and a light-emitting element are formed over a substrate. The light-emitting element can have any of the following structures: a top emission structure in which light is extracted through a surface opposite to the substrate; a bottom emission structure in which light is extracted through a surface on the substrate side; or a dual emission structure in which light is extracted through the surface opposite to the substrate and the surface on the substrate side.

An example of a light-emitting device in which a light-emitting element is used as the display element is illustrated in FIG. 7. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031. The structure of the light-emitting element 4513 can be changed as appropriate depending on the direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light is diffused by projections and depressions on the surface so that the glare can be reduced can be performed.

Further, electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent or a solute; each microcapsule includes first particles which are positively charged and second particles which are negatively charged. By applying an electric field to the microcapsules, the particles in the microcapsules move in opposite directions to each other and only the color of the particles gathering on one side is displayed. Note that the first particles and the second particles each include pigment and do not move without an electric field. Further, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have pigment, color display can be achieved.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

FIG. 8 illustrates active matrix electronic paper as one embodiment of a semiconductor device. The electronic paper in FIG. 8 is an example of a display device using a twisting ball display system.

Between the first electrode layer 4030 connected to the transistor 4010 and the second electrode layer 4031 provided on the second substrate 4006, spherical particles 4613 each of which includes a black region 4615*a*, a white region 4615*b*, and a cavity 4612 around the regions which is filled with liquid are provided. A space around the spherical particles 4613 is filled with a filler 4614 such as a resin. The second electrode layer 4031 corresponds to a common electrode (a counter electrode). The second electrode layer 4031 is electrically connected to a common potential line.

In FIG. 6, FIG. 7, and FIG. 8, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarization insulating film. Other than such organic insulating materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed using any of these materials.

There is no particular limitation on the method for forming the insulating layer 4021, and the following method can be used depending on the material: a sputtering method, a spin coating method, a dipping method, spray coating, a droplet discharge method (such as an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which is also referred to as a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, the first electrode layer 4030 and the second electrode layer 4031 can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition including a conductive high molecular weight molecule (also referred to as a conductive polymer) can be used for the first electrode layer 4030 and the second electrode layer 4031. As the conductive high molecular weight molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

As described above, by using the transistor described in Embodiment 1, a semiconductor device having high reliability can be provided. Note that the transistor described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, methods, and the like described in this embodiment can be combined as appropriate with any of the structures, methods, and the like described in the other embodiments.

Embodiment 3

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game machine, a portable information terminal, an audio reproducing device, a large-sized game machine such as a pachinko machine, and the like.

Examples of an electronic device including the liquid crystal display device described in the above embodiment will be described.

Figure 9A:
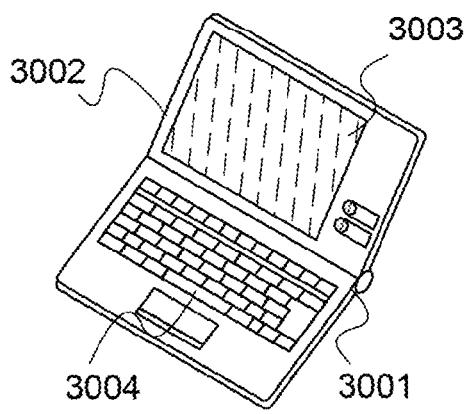
FIGS. 9A to 9F illustrate electronic devices.

FIG. 9A illustrates a laptop personal computer which includes a main body 3001, a housing 3002, a display portion 3003, a keyboard 3004, and the like. By applying the semiconductor device described in Embodiment 1 or 2, the laptop personal computer can have high reliability.

Figure 9B:
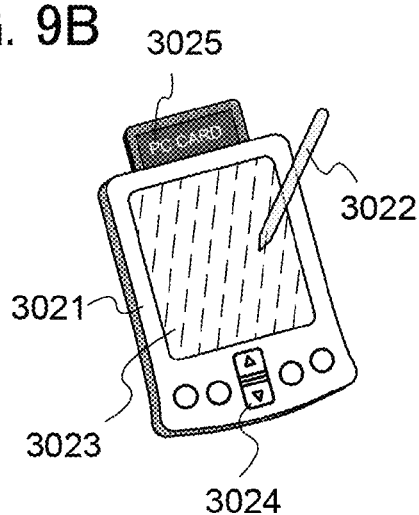

FIG. 9B illustrates a portable information terminal (PDA) which includes a display portion 3023, an external interface 3025, operation buttons 3024, and the like in a main body 3021. A stylus 3022 is provided as an accessory for operation. By applying the semiconductor device described in Embodiment 1 or 2, the portable information terminal (PDA) can have higher reliability.

Figure 9C:
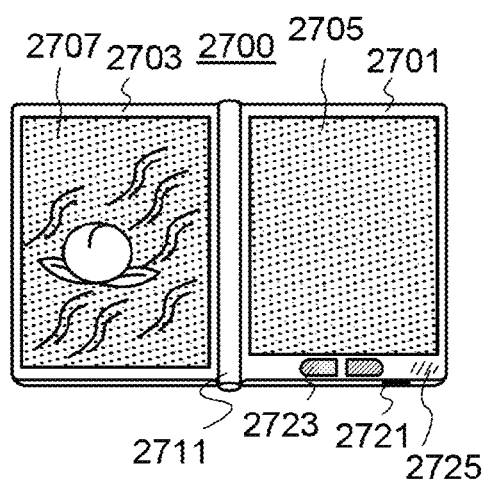

FIG. 9C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be used like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 9C) can display text and a display portion on the left side (the display portion 2707 in FIG. 9C) can display graphics. By applying the semiconductor device described in Embodiment 1 or 2, the electronic book reader 2700 can have high reliability.

Further, FIG. 9C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (such as an earphone terminal or a USB terminal), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 9D:
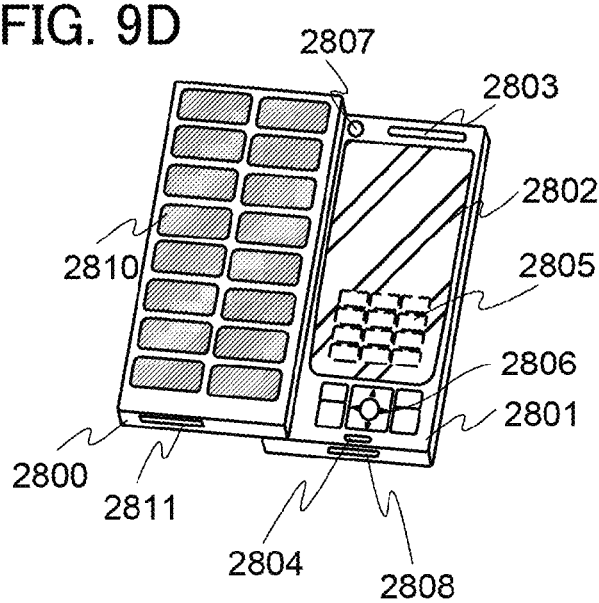

FIG. 9D illustrates a mobile phone which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charging the portable information terminal, an external memory slot 2811, and the like. Further, an antenna is incorporated in the housing 2801. By applying the semiconductor device described in Embodiment 1 or 2, the mobile phone can have high reliability.

Further, the display panel 2802 is provided with a touch panel. A plurality of operation keys 2805 that is displayed as images is illustrated by dashed lines in FIG. 9D. Note that a boosting circuit by which voltage output from the solar cell 2810 is raised to be sufficiently high for each circuit is also provided.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a larger amount of data can be saved and moved by inserting a recording medium to the external memory slot 2811.

Further, in addition to the above functions, an infrared communication function, a television reception function, or the like may be provided.

Figure 9E:
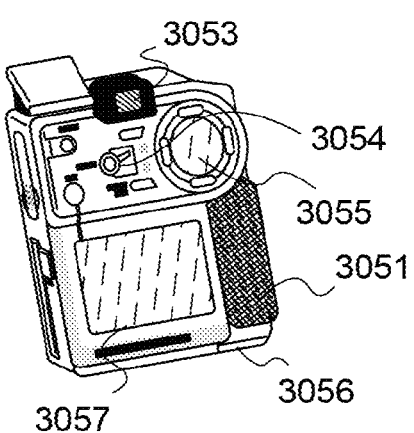

FIG. 9E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 9F:
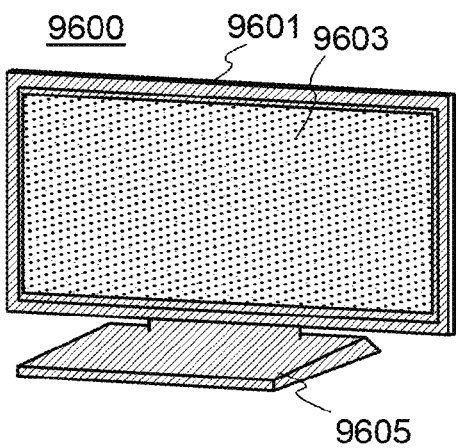

FIG. 9F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, a general television broadcast can be received. Moreover, when the television set is connected to a communication network with or without wires via the modem, one-way (from a sender to a receiver) or two-way (between a sender and a receiver or between receivers) data communication can be performed.

The structures, methods, and the like described in this embodiment can be combined as appropriate with any of the structures, methods, and the like described in the other embodiments.

Example 1

In this example, a contact hole formed in the following manner was evaluated: insulating films were formed so that a first silicon oxide ($SiO_x$) film, a gallium oxide ($GaO_x$) film, and a second silicon oxide ($SiO_x$) film were sequentially stacked in a manner similar to that of Embodiment 1, and dry etching was performed on the insulating films with the use of a photolithography step.

Firstly, a manufacturing process of the insulating films used in this example, in which the first silicon oxide film, the gallium oxide film, and the second silicon oxide film were sequentially stacked, is described.

First, the first silicon oxide film was formed over a tungsten substrate so as to have a thickness of 100 nm Here, the first silicon oxide film was formed by a sputtering method under conditions where the flow rate of an argon gas was 25 sccm, the flow rate of an oxygen gas was 25 sccm, the power of an RF power source was 2 kW, the pressure was 0.4 Pa, and the temperature was 100° C.

Next, the gallium oxide film was formed over and in contact with the first silicon oxide film so as to have a thickness of 100 nm Here, gallium oxide was deposited by a sputtering method under conditions where the flow rate of an argon gas was 10.5 sccm, the flow rate of an oxygen gas was 4.5 sccm, the power of the RF power source was 200 W, the pressure was 0.4 Pa, and the temperature was room temperature.

Next, the second silicon oxide film was formed over the gallium oxide film so as to have a thickness of 300 nm Here, the second silicon oxide film was formed by a sputtering method under conditions where the flow rate of an argon gas was 40 sccm, the flow rate of an oxygen gas was 10 sccm, the power of the RF power source was 1.5 kW, the pressure was 0.4 Pa, and the temperature was 100° C. Through the above steps, the insulating films in which the first silicon oxide film, the gallium oxide film, and the second silicon oxide film were sequentially stacked were formed.

Then, dry etching was performed on the insulating films, so that a contact hole was formed. Here, a contact hole was formed by forming a resist mask over the second silicon oxide film, performing dry etching on the insulating films, and removing the resist mask by only ashing using oxygen plasma, so that Sample A was formed. A contact hole was formed by forming a resist mask over the second silicon oxide film, performing rinse treatment, performing dry etching on the insulating films, and removing the resist mask by ashing using oxygen plasma and treatment using a resist stripper solution, so that Sample B was formed.

A manufacturing process of Sample A is described in detail. First, the resist mask was formed over the second silicon oxide film by a photolithography method. Here, in the manufacture of Sample A, rinse treatment was not performed when a resist pattern was formed.

Next, with the use of the resist mask, dry etching was performed on the insulating films having the structure in which the first silicon oxide film, the gallium oxide film, and the second silicon oxide film were sequentially stacked, so that the contact hole was formed. Here, the dry etching was performed by an ICP etching method. Etching conditions were set as follows: the flow rate of a trifluoromethan gas was 7.5 sccm; the flow rate of a helium gas was 142.5 sccm; the power applied to a coil-shaped electrode was 475 W; the power applied to an electrode on the substrate side was 300 W; the pressure was 5.5 Pa, and the temperature of a lower electrode was 70° C.

Then, the resist mask formed over the second silicon oxide film was removed by only ashing using oxygen plasma. Here, conditions of the ashing treatment using oxygen plasma were set as follows: the flow rate of an oxygen gas was 300 sccm; the power of the RF power source was 1800 W; the pressure was 66.5 Pa; and the treatment time was 180 seconds. Through the above steps, Sample A was manufactured where the contact hole was formed in the insulating films in which the first silicon oxide film, the gallium oxide film, and the second silicon oxide film were sequentially stacked.

Next, a manufacturing process of Sample B is described in detail. A difference between the manufacturing processes of Sample A and Sample B is in that rinse treatment was performed in the manufacturing process of Sample B when a resist pattern was formed. In addition, in the manufacturing process of Sample B, the resist mask was removed by ashing using oxygen plasma and treatment using a resist stripper solution. Conditions of the ashing treatment were set as follows: the flow rate of an oxygen gas was 100 sccm; the power of the RF power source was 200 W; the pressure was 66.5 Pa; and the treatment time was 300 seconds. As the resist stripper solution, a stripping agent N-300 (produced by Nagase & Co., Ltd.) was used. The other steps of manufacturing Sample B were performed by a method similar to that of the manufacturing process of Sample A.

Figure 10A:
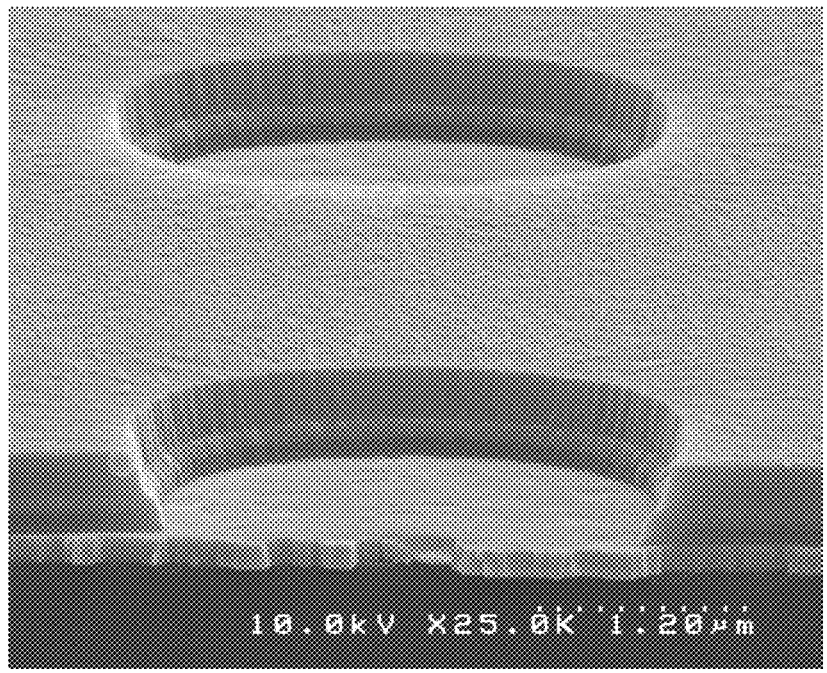
FIGS. 10A and 10B are SEM images of samples according to Example 1.
Figure 10B:
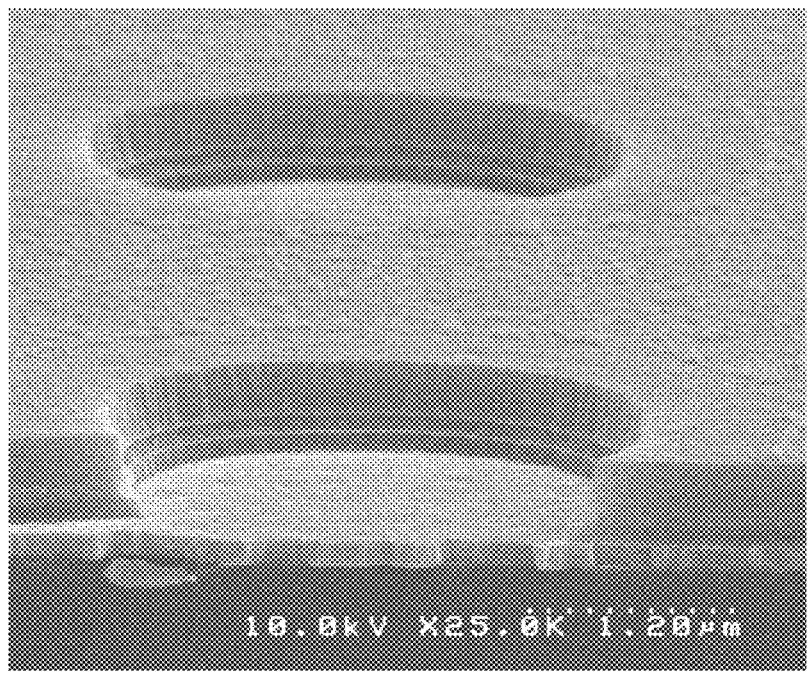

FIGS. 10A and 10B are SEM images of Sample A and Sample B, respectively. When FIGS. 10A and 10B are compared with each other, a surface of the second silicon oxide film is kept clean in Sample A, whereas a residue of the resist mask, a reaction product of the residue, and the like remain on a surface of the second silicon oxide film in Sample B.

Figure 11A:
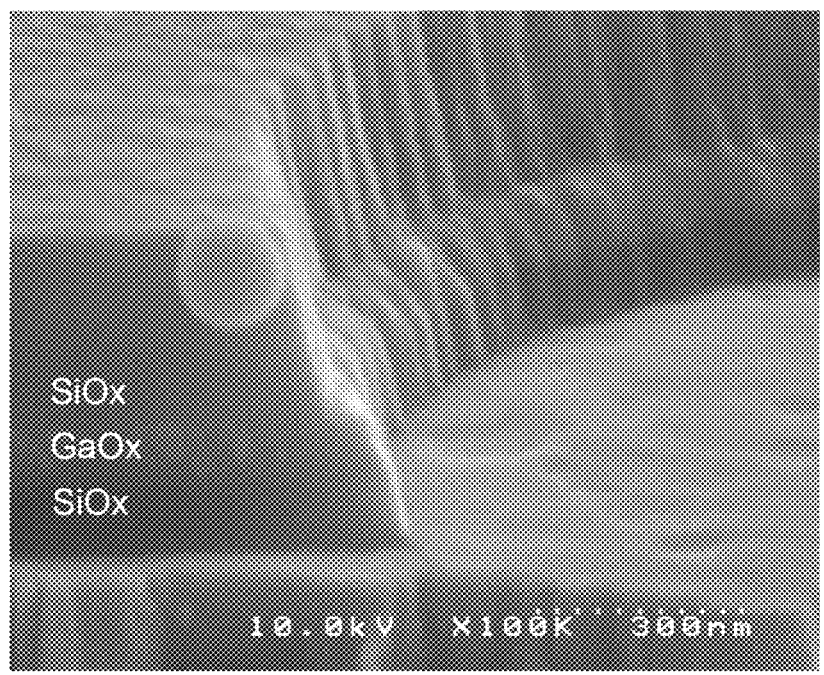
FIGS. 11A and 11B are SEM images of samples according to Example 1.
Figure 11B:
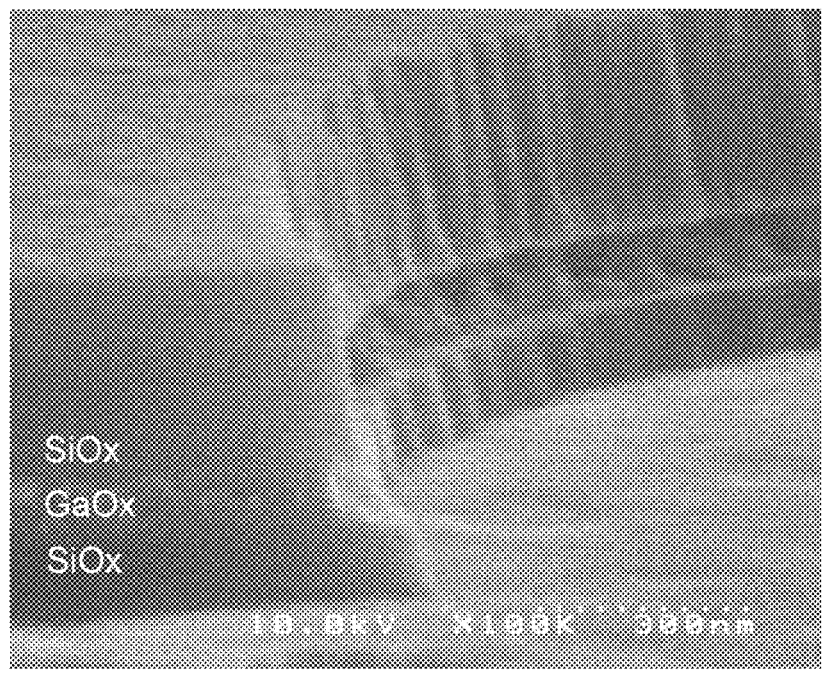

FIGS. 11A and 11B are respective enlarged SEM images of cross-sectional portions of the insulating films in the SEM images of FIGS. 10A and 10B. From comparison between FIGS. 11A and 11B, it is found that a sidewall of the contact hole projects in the gallium oxide film portion to form a stepped shape in Sample A, whereas a sidewall of the contact hole is deeply dissolved in the gallium oxide film portion to form a depression in Sample B. Thus, the gallium oxide film in the sidewall portion, which is needed for the contact hole, is also removed in Sample B.

As described above, a region which is in a gallium oxide film and is needed in design might be dissolved by wet treatment such as rinse treatment or treatment using a resist stripper solution as in Sample B. Therefore, by employing a manufacturing process in which a gallium oxide film is not directly subjected to wet treatment in a step of forming a contact hole in an insulating film including gallium oxide as in Sample A, a possibility that a region which is in the gallium oxide film and is needed in design is dissolved can be reduced.

EXPLANATION OF REFERENCES

110: transistor, 200: substrate, 202: gate electrode, 204: insulating film, 206: oxide semiconductor film, 208a: source electrode, 208b: drain electrode, 210: insulating film, 212: insulating film, 214: resist mask, 216: wiring, 218: contact hole, 222: wiring, 224: contact hole, 301: target, 302: target, 310: transistor, 400: substrate, 402: gate electrode, 406: oxide semiconductor film, 408a: source electrode, 408b: drain electrode, 410: insulating film, 412: insulating film, 414: resist mask, 416: wiring, 418: contact hole, 2700: electronic book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion B, 3056: battery, 3057: display portion A, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4018a: FPC, 4018b: FPC, 4019: anisotropic conductive film, 4021: insulating layer, 4030: electrode layer, 4031: electrode layer, 4032: insulating film, 4033: insulating film, 4510: partition wall, 4511: electroluminescent layer, 4513: light-emitting element, 4514: filler, 4612: cavity, 4613: spherical particle, 4614: filler, 4615a: black region, 4615b: white region, 9600: television set, 9601: housing, 9603: display portion, and 9605: stand. This application is based on Japanese Patent Application serial no. 2010-139715 filed with Japan Patent Office on Jun. 18, 2010, the entire contents of which are hereby incorporated by reference.

The invention claimed is:

1. A semiconductor device comprising:
   an oxide semiconductor layer comprising a channel formation region over an insulating surface;
   a source electrode and a drain electrode connected to the oxide semiconductor layer;
   a first layer over and in contact with the source electrode, the drain electrode, and the channel formation region;
   a second layer over the first layer; and
   a wiring over the second layer;
   wherein the first layer comprises gallium and oxygen,
   wherein the wiring is connected to the source electrode or the drain electrode through a contact hole in the first layer and the second layer, and
   wherein a diameter of the contact hole in the first layer is smaller than a diameter of the contact hole in the second layer.

2. The semiconductor device according to claim 1, wherein the first layer comprises aluminum oxide.

3. The semiconductor device according to claim 1, wherein the first layer is an insulating layer comprising gallium oxide.

4. The semiconductor device according to claim 1, wherein the second layer is an insulating layer comprising silicon and at least one of oxygen and nitrogen.

5. The semiconductor device according to claim 1, wherein the second layer is over and in contact with the first layer.

6. The semiconductor device according to claim 1, further comprising a gate electrode below the oxide semiconductor layer.

7. The semiconductor device according to claim 1, further comprising a gate electrode over the oxide semiconductor layer.

8. The semiconductor device according to claim 1, wherein the contact hole includes a stepped shape.

9. The semiconductor device according to claim 1, wherein the oxide semiconductor layer comprises gallium.

10. A semiconductor device comprising:
    an oxide semiconductor layer comprising a channel formation region over an insulating surface, the oxide semiconductor layer comprising indium and zinc;
    a source electrode and a drain electrode connected to the oxide semiconductor layer;
    a first layer over and in contact with the source electrode, the drain electrode, and the channel formation region;
    a gate insulating layer over the first layer;
    a gate electrode over the gate insulating layer;
    a second layer over the gate electrode; and
    a wiring over the second layer;
    wherein the first layer comprises gallium and oxygen, and
    wherein the wiring is connected to the source electrode or the drain electrode through a contact hole in the first layer and the second layer.

11. The semiconductor device according to claim 10, wherein the first layer comprises aluminum oxide.

12. The semiconductor device according to claim 10, wherein the first layer is an insulating layer comprising gallium oxide.

13. The semiconductor device according to claim 10, wherein the second layer is an insulating layer comprising silicon and at least one of oxygen and nitrogen.

14. The semiconductor device according to claim 10, wherein the second layer is over and in contact with the first layer.

15. The semiconductor device according to claim 10, wherein the contact hole includes a stepped shape.

16. The semiconductor device according to claim 10, wherein the oxide semiconductor layer comprises gallium.

* * * * *